US010647487B2

(12) United States Patent
Sasaki et al.

(10) Patent No.: US 10,647,487 B2
(45) Date of Patent: May 12, 2020

(54) MULTILAYER STRUCTURE, METHOD FOR PRODUCING SAME, PACKAGING MATERIAL AND PRODUCT INCLUDING SAME, AND PROTECTIVE SHEET FOR ELECTRONIC DEVICE

(71) Applicant: KURARAY CO., LTD., Kurashiki-shi (JP)

(72) Inventors: Ryoichi Sasaki, Kurashiki (JP); Yasutaka Inubushi, Kurashiki (JP); Masahiko Ota, Kurashiki (JP); Yasushi Morihara, Kurashiki (JP); Masakazu Nakaya, Kurashiki (JP)

(73) Assignee: KURRAY CO., LTD., Kurashiki-shi (JP)

( * ) Notice: Subject to any disclaimer, the term of this patent is extended or adjusted under 35 U.S.C. 154(b) by 237 days.

(21) Appl. No.: 15/760,712

(22) PCT Filed: Sep. 16, 2016

(86) PCT No.: PCT/JP2016/004261
§ 371 (c)(1),
(2) Date: Mar. 16, 2018

(87) PCT Pub. No.: WO2017/047103
PCT Pub. Date: Mar. 23, 2017

(65) Prior Publication Data
US 2018/0251278 A1    Sep. 6, 2018

(30) Foreign Application Priority Data

Sep. 17, 2015 (JP) .................. 2015-184409
Sep. 17, 2015 (JP) .................. 2015-184410
Sep. 17, 2015 (JP) .................. 2015-184411

(51) Int. Cl.
*B65D 65/40* (2006.01)
*B32B 27/18* (2006.01)
(Continued)

(52) U.S. Cl.
CPC .............. *B65D 65/406* (2013.01); *A61J 1/10* (2013.01); *A61J 1/1462* (2013.01); *A61J 1/1468* (2015.05);
(Continued)

(58) Field of Classification Search
CPC ...... B65D 65/406; B65D 65/40; B32B 27/18; B32B 9/00; B32B 27/00; B32B 29/002;
(Continued)

(56) References Cited

U.S. PATENT DOCUMENTS

2013/0034674 A1    2/2013   Yoshida et al.
2015/0050480 A1    2/2015   Suzuki et al.
(Continued)

FOREIGN PATENT DOCUMENTS

JP    2013-202973 A    10/2013
JP    2015-73748 A     4/2015
(Continued)

OTHER PUBLICATIONS

Extended European Search Report dated Jan. 31, 2019 in European Patent Application No. 16845977.4, 8 pages.
(Continued)

*Primary Examiner* — Michael C Miggins
(74) *Attorney, Agent, or Firm* — Oblon, McClelland, Maier & Neustadt, L.L.P.

(57) ABSTRACT

The present invention relates to a multilayer structure including a base (X), a layer (Y), and a layer (Z), wherein the layer (Y) contains an aluminum-containing compound (A), and the layer (Z) contains an organic phosphorus
(Continued)

compound (BO) and a polymer (F) having an ether bond and having no glycosidic bond.

20 Claims, 4 Drawing Sheets

(51) Int. Cl.
| | |
|---|---|
| B32B 9/00 | (2006.01) |
| B32B 27/00 | (2006.01) |
| B32B 29/00 | (2006.01) |
| H01L 31/048 | (2014.01) |
| B32B 27/06 | (2006.01) |
| B32B 27/34 | (2006.01) |
| A61J 1/10 | (2006.01) |
| B32B 7/12 | (2006.01) |
| A61J 1/14 | (2006.01) |
| H01L 31/049 | (2014.01) |
| B32B 27/10 | (2006.01) |
| B32B 27/36 | (2006.01) |
| B32B 27/08 | (2006.01) |
| B32B 27/32 | (2006.01) |
| B32B 37/15 | (2006.01) |
| C08J 7/04 | (2020.01) |
| C09D 171/02 | (2006.01) |
| H01L 51/52 | (2006.01) |
| C08K 5/49 | (2006.01) |

(52) U.S. Cl.
CPC .............. *A61J 1/1475* (2013.01); *B32B 7/12* (2013.01); *B32B 9/00* (2013.01); *B32B 27/00* (2013.01); *B32B 27/06* (2013.01); *B32B 27/08* (2013.01); *B32B 27/10* (2013.01); *B32B 27/18* (2013.01); *B32B 27/32* (2013.01); *B32B 27/34* (2013.01); *B32B 27/36* (2013.01); *B32B 29/002* (2013.01); *B32B 37/15* (2013.01); *B65D 65/40* (2013.01); *C08J 7/0427* (2020.01); *C09D 171/02* (2013.01); *H01L 31/048* (2013.01); *H01L 31/049* (2014.12); *H01L 31/0481* (2013.01); B32B 2250/03 (2013.01); B32B 2250/24 (2013.01); B32B 2255/10 (2013.01); B32B 2255/12 (2013.01); B32B 2255/26 (2013.01); B32B 2255/28 (2013.01); B32B 2307/306 (2013.01); B32B 2307/412 (2013.01); B32B 2307/7244 (2013.01); B32B 2307/7246 (2013.01); B32B 2439/46 (2013.01); B32B 2571/00 (2013.01); C08J 2367/02 (2013.01); C08J 2471/02 (2013.01); C08K 5/49 (2013.01); H01L 51/5253 (2013.01)

(58) Field of Classification Search
CPC ........... B32B 27/06; B32B 27/34; B32B 7/12; B32B 27/10; B32B 27/36; B32B 27/08; B32B 27/32; B32B 37/15; B32B 2571/00; B32B 2307/7256; B32B 2307/7244; B32B 2255/28; B32B 2250/24; B32B 2307/306; B32B 2307/412; B32B 2255/26; B32B 2439/46; B32B 2250/03; B32B 2255/10; H01L 31/0481; H01L 31/049; H01L 31/048; H01L 51/5253; A61J 1/10; A61J 1/1475; A61J 1/1468; C08J 7/1427; C08J 2367/02; C08J 2471/02; C08K 5/49; C09D 171/02
See application file for complete search history.

(56) References Cited

U.S. PATENT DOCUMENTS

| | | |
|---|---|---|
| 2015/0367614 A1 | 12/2015 | Sasaki et al. |
| 2015/0368503 A1 | 12/2015 | Sasaki et al. |
| 2015/0373858 A1 | 12/2015 | Sasaki et al. |
| 2017/0088324 A1 | 3/2017 | Sasaki et al. |
| 2017/0096538 A1 | 4/2017 | Sasaki et al. |
| 2017/0229047 A1 | 8/2017 | Inubushi et al. |
| 2018/0015713 A1 | 1/2018 | Inubushi et al. |
| 2018/0022073 A1 | 1/2018 | Sasaki et al. |
| 2018/0093460 A1 | 4/2018 | Inubushi et al. |
| 2019/0055467 A1 | 2/2019 | Ota et al. |

FOREIGN PATENT DOCUMENTS

| | | |
|---|---|---|
| JP | 2015-74475 A | 4/2015 |
| JP | 2015-75182 A | 4/2015 |
| WO | 2011/122036 A1 | 10/2011 |
| WO | 2014/122942 A1 | 8/2014 |
| WO | WO 2014/122940 A1 | 8/2014 |
| WO | WO 2015/141225 A1 | 9/2015 |
| WO | WO 2015/141226 A1 | 9/2015 |
| WO | WO 2016/024380 A1 | 2/2016 |
| WO | WO 2016/103716 A1 | 6/2016 |
| WO | WO 2016/103719 A1 | 6/2016 |
| WO | WO 2016/103720 A1 | 6/2016 |
| WO | WO 2016/157907 A1 | 10/2016 |

OTHER PUBLICATIONS

International Search Report dated Nov. 29, 2016 in PCT/JP2016/004261 filed Sep. 16, 2016.

MULTILAYER STRUCTURE, METHOD FOR PRODUCING SAME, PACKAGING MATERIAL AND PRODUCT INCLUDING SAME, AND PROTECTIVE SHEET FOR ELECTRONIC DEVICE

TECHNICAL FIELD

The present invention relates to a multilayer structure, a method for producing the multilayer structure, a packaging material and product including the multilayer structure, and a protective sheet for electronic devices.

BACKGROUND ART

Multilayer structures in which a gas barrier layer containing aluminum or aluminum oxide as a component is formed on a plastic film have been conventionally well-known. Such multilayer structures are used as packaging materials for protecting articles (such as foods) which are susceptible to quality change induced by oxygen. In many cases, such a gas barrier layer is formed on a plastic film by a dry process such as physical vapor deposition (PVD) or chemical vapor deposition (CVD).

For example, Patent Literature 1 discloses a composite structure having a gas barrier layer containing aluminum, the composite structure having a transparent gas barrier layer comprising a reaction product of aluminum oxide particles and a phosphorus compound. Patent Literature 1 discloses a method for forming the gas barrier layer, in which a coating liquid containing aluminum oxide particles and a phosphorus compound is applied onto a plastic film, then dried and heat-treated.

In an attempt to allow such a composite structure to maintain gas barrier properties at a high level when exposed to physical stresses, Patent Literature 2 discloses that a layer containing a polymer having a plurality of phosphorus atoms is stacked contiguous to a layer containing aluminum atoms.

CITATION LIST

Patent Literature

Patent Literature 1: WO 2011/122036 A1
Patent Literature 2: WO 2014/122942 A1

SUMMARY OF INVENTION

Technical Problem

However, in some cases where the present inventors used the multilayer structures of Patent Literatures 1 and 2 as packaging materials, the multilayer structures experienced a decrease in interlayer adhesion to an adjacent layer such as an adhesive layer and suffered from delamination after retorting. In addition, in some cases where the present inventors used the multilayer structures of Patent Literatures 1 and 2 in electronic devices, the multilayer structures suffered from delamination after a damp heat test.

Thus, there is a demand for gas-barrier multilayer structures that are not only capable of maintaining gas barrier properties at a high level when exposed to physical stresses but also capable of retaining good properties even after retorting or retaining good interlayer adhesion even at high temperature and high humidity.

An object of the present invention is to provide: a novel multilayer structure that not only has good gas barrier properties and good water vapor barrier properties but also is capable of maintaining good barrier properties even after retorting and stretching and retaining good interlayer adhesion (peel strength) without suffering from appearance defect such as delamination after retorting; and a packaging material including the multilayer structure.

Another object of the present invention is to provide a protective sheet for electronic devices that includes a novel multilayer structure that not only has good gas barrier properties and good water vapor barrier properties but also retains good interlayer adhesion even at high temperature and high humidity.

Solution to Problem

As a result of intensive studies, the present inventors have found that the above objects can be achieved by providing a multilayer structure including particular layers and have made the present invention on the basis of the finding.

The present invention provides a multilayer structure including a base (X), a layer (Y), and a layer (Z), wherein the layer (Y) contains an aluminum-containing compound (A), and the layer (Z) contains an organic phosphorus compound (BO) and a polymer (F) having an ether bond and having no glycosidic bond.

The multilayer structure of the present invention may include at least one pair of the layer (Z) and the layer (Y) that are disposed contiguous to each other.

In the multilayer structure of the present invention, the aluminum-containing compound (A) may be a compound (Ab) including a reaction product (D) of an aluminum-containing metal oxide (Aa) and an inorganic phosphorus compound (BI).

In the multilayer structure of the present invention, the ratio $W_{BO}/W_{BI}$ between the mass $W_{BI}$ of the inorganic phosphorus compound (BI) and the mass $W_{BO}$ of the organic phosphorus compound (BO) is preferably 0.06 or more.

In the multilayer structure of the present invention, the mass ratio between the organic phosphorus compound (BO) and the polymer (F) is preferably 30:70 to 99:1.

In the multilayer structure of the present invention, the organic phosphorus compound (BO) may be a polymer having at least one functional group selected from the group consisting of a phosphoric acid group, a phosphorous acid group, a phosphonic acid group, a phosphonous acid group, a phosphinic acid group, and a phosphinous acid group.

In the multilayer structure of the present invention, the polymer (F) may be polyethylene glycol or polyethylene oxide.

In the multilayer structure of the present invention, the base (X) may include at least one layer selected from the group consisting of a thermoplastic resin film layer and a paper layer.

The present invention also provides a packaging material including any one of the multilayer structures as defined above.

The packaging material may further include a layer formed by extrusion coating lamination.

The packaging material may be a vertical form-fill-seal bag, a vacuum packaging bag, a pouch, a laminated tube container, an infusion bag, a paper container, a strip tape, a container lid, or an in-mold labeled container.

The present invention further provides a product including any one of the packaging materials as defined above at least in a part of the product.

The product may be a vacuum insulator, wherein the product contains a substance in an interior thereof, the substance is a core material, and the interior of the product has a reduced pressure.

The present invention also provides a protective sheet for electronic devices, the protective sheet including any one of the multilayer structures as defined above.

The protective sheet for electronic devices may be a protective sheet for protecting a surface of a photoelectric conversion device, information display device, or lighting device.

The present invention also provides an electronic device including any one of the protective sheets as defined above.

Advantageous Effects of Invention

The present invention makes it possible to obtain: a novel multilayer structure having good gas barrier properties and good water vapor barrier properties and having high retort resistance and high stretching resistance; and a packaging material including the multilayer structure. That is, the present invention makes it possible to obtain: a novel multilayer structure that not only has good gas barrier properties and good water vapor barrier properties but also is capable of maintaining good barrier properties even after retorting and stretching and retaining good interlayer adhesion (peel strength) without suffering from appearance defect such as delamination after retorting; and a packaging material including the multilayer structure. The present invention also makes it possible to obtain a protective sheet for electronic devices that includes a novel multilayer structure having good gas barrier properties and good water vapor barrier properties and retaining good interlayer adhesion even at high temperature and high humidity. That is, the present invention makes it possible to obtain an electronic device including a protective sheet including a novel multilayer structure that not only has good gas barrier properties and good water vapor barrier properties but also is capable of maintaining good gas barrier properties and good water vapor barrier properties even after a damp heat test and retaining good interlayer adhesion (peel strength) without suffering from appearance defect such as delamination after a damp heat test.

DESCRIPTION OF EMBODIMENTS

Figure 1:
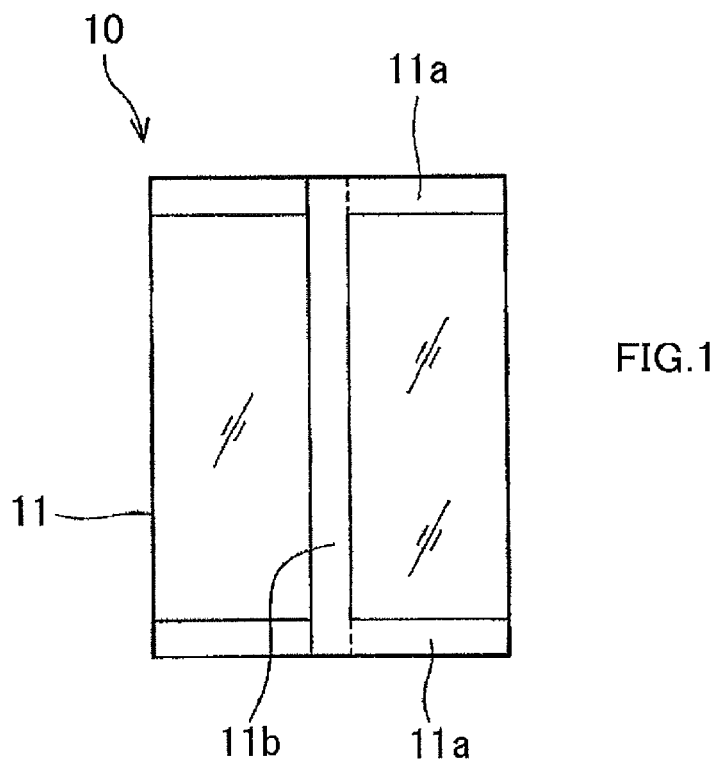
FIG. 1 is a schematic diagram of a vertical form-fill-seal bag according to an embodiment of the present invention.

Hereinafter, the present invention will be described with reference to examples. The following description gives examples of materials, conditions, techniques, and value ranges; however, the present invention is not limited to those mentioned as examples. The materials given as examples may be used alone or may be used in combination with one another, unless otherwise specified. The upper and lower limits of value ranges (such as the ranges of the contents of the components, the ranges of values calculated for the components, and the ranges of values of various properties) described herein can be combined as appropriate.

Unless otherwise specified, the meaning of an expression like "a particular layer is stacked on a particular member (such as a base or layer)" as used herein encompasses not only the case where the particular layer is stacked in contact with the member but also the case where the particular layer is stacked above the member, with another layer interposed therebetween. The same applies to expressions like "a particular layer is formed on a particular member (such as a base or layer)" and "a particular layer is disposed on a particular member (such as a base or layer)". Unless otherwise specified, the meaning of an expression like "a liquid (such as a coating liquid) is applied onto a particular member (such as a base or layer)" encompasses not only the case where the liquid is applied directly to the member but also the case where the liquid is applied to another layer formed on the member.

[Multilayer Structure]

The multilayer structure of the present invention includes a base (X), a layer (Y), and a layer (Z). The layer (Y) contains an aluminum-containing compound (A) (which hereinafter may be simply referred to as "compound (A)"). The layer (Z) contains an organic phosphorus compound (BO) and a polymer (F) having an ether bond and having no glycosidic bond (such a polymer may hereinafter be simply referred to as "polymer (F)"). The term "multilayer structure" as used in the following description refers to a multilayer structure including the base (X), the layer (Y), and the layer (Z).

In the layer (Z), at least a part of the organic phosphorus compound (BO) may react with at least a part of the polymer (F). When the organic phosphorus compound (BO) has undergone a reaction in the layer (Z), a moiety derived from the organic phosphorus compound (BO) in the reaction product is regarded as the organic phosphorus compound (BO). In this case, the mass of the organic phosphorus compound (BO) used in the formation of the reaction product (the mass of the organic phosphorus compound (BO) that has yet to undergo the reaction) is included in the mass of the organic phosphorus compound (BO) in the layer (Z). When the polymer (F) has undergone a reaction in the layer (Z), a moiety derived from the polymer (F) in the reaction product is regarded as the polymer (F). In this case, the mass of the polymer (F) used in the formation of the reaction product (the mass of the polymer (F) that has yet to undergo the reaction) is included in the mass of the polymer (F) in the layer (Z).

[Base (X)]

The material of the base (X) is not particularly limited, and a base made of any of various materials can be used. Examples of the material of the base (X) include: resins such as thermoplastic resins and thermosetting resins; fiber assemblies such as fabrics and paper; wood; and glass. Among these, thermoplastic resins and fiber assemblies are preferred, and thermoplastic resins are more preferred. The form of the base (X) is not particularly limited. The base (X) may be a laminar base such as a film or sheet. The base (X) preferably includes at least one layer selected from the group consisting of a thermoplastic resin film layer and a paper layer, more preferably includes a thermoplastic resin film layer, and is even more preferably a thermoplastic resin film layer.

Examples of thermoplastic resins that may be used in the base (X) include: polyolefin resins such as polyethylene and polypropylene; polyester resins such as polyethylene terephthalate (PET), polyethylene-2,6-naphthalate, polybutylene terephthalate, and copolymers thereof; polyamide resins such as nylon-6, nylon-66, and nylon-12; hydroxy group-containing polymers such as polyvinyl alcohol and ethylene-vinyl alcohol copolymer; polystyrene; poly(meth)acrylic acid esters; polyacrylonitrile; polyvinyl acetate; polycarbonate; polyarylate; regenerated cellulose; polyimide; polyetherimide; polysulfone; polyethersulfone; polyetheretherketone; and ionomer resins. When the multilayer structure is used as or in a packaging material, the material of the base (X) is preferably at least one thermoplastic resin selected from the group consisting of polyethylene, polypropylene, polyethylene terephthalate, nylon-6, and nylon-66.

When a film made of such a thermoplastic resin is used as the base (X), the base (X) may be an oriented film or non-oriented film. In terms of high suitability for processes (such as printing and lamination) of the resulting multilayer structure, an oriented film, particularly a biaxially-oriented film, is preferred. The biaxially-oriented film may be a biaxially-oriented film produced by any one method selected from simultaneous biaxial stretching, sequential biaxial stretching, and tubular stretching.

Examples of paper that may be used in the base (X) include kraft paper, high-quality paper, simili paper, glassine paper, parchment paper, synthetic paper, white paperboard, manila board, milk carton board, cup paper, and ivory paper. The use of paper in the base (X) makes it possible to obtain a multilayer structure for a paper container.

When the base (X) is in the form of a layer, the thickness of the base (X) is preferably 1 to 1,000 µm, more preferably 5 to 500 µm, and even more preferably 9 to 200 µm, in terms of high mechanical strength and good processability of the resulting multilayer structure.

[Layer (Y)]

The multilayer structure of the present invention includes a layer (Y) containing an aluminum-containing compound (A). When a plurality of layers (Y) and/or a plurality of layers (Z) are provided, the multilayer structure preferably includes at least one pair of the layer (Y) and the layer (Z) that are stacked contiguous to (in contact with) each other. The layer (Y) preferably further contains an inorganic phosphorus compound (BI). The inorganic phosphorus compound (SI) has a functional group containing a phosphorus atom. The compound (A) and the inorganic phosphorus compound (BI) will now be described.

[Aluminum-Containing Compound (A)]

The compound (A) may be an aluminum-containing metal oxide (Aa) or a compound (Ab) including a reaction product (D) formed by a reaction between the aluminum-containing metal oxide (Aa) (which hereinafter may be simply referred to as "metal oxide (Aa)") and the inorganic phosphorus compound (BI) (such a compound including the reaction product (D) may hereinafter be simply referred to as "compound (Ab)"). The aluminum-containing metal oxide (Aa) is typically in the form of particles when reacted with the inorganic phosphorus compound (BI).

[Aluminum-Containing Metal Oxide (Aa)]

The metal atoms constituting the aluminum-containing metal oxide (Aa) (the metal atoms may be collectively referred to as "metal atoms (M)") include at least one metal atom selected from atoms of metals belonging to Groups 2 to 14 of the periodic table, and include at least aluminum atoms. The metal atoms (M) may consist only of aluminum atoms or may include aluminum atoms and other metal atoms. One metal oxide may be used alone as the metal oxide (Aa), or a combination of two or more metal oxides may be used as the metal oxide (Aa).

The proportion of aluminum atoms in the metal atoms (M) is typically 50 mol % or more, and may be 60 to 100 mol % or 80 to 100 mol %. Examples of the metal oxide (Aa) include metal oxides produced by methods such as liquid-phase synthesis, gas-phase synthesis, and solid grinding.

The metal oxide (Aa) may be a hydrolytic condensate of a compound (E) containing a metal atom (M) to which a hydrolyzable characteristic group is bonded. Examples of the characteristic group include $R^1$ in the general formula [I] described below. The hydrolytic condensate of the compound (E) can be regarded substantially as a metal oxide. Thus, the hydrolytic condensate of the compound (E) may be referred to as "metal oxide (Aa)" herein. That is, the term "metal oxide (Aa)" as used herein is interchangeable with the term "hydrolytic condensate of the compound (E)", while the term "hydrolytic condensate of the compound (E)" as used herein is interchangeable with the term "metal oxide (Aa)".

[Compound (E) Containing Metal Atom (M) to which Hydrolyzable Characteristic Group is Bonded]

In terms of ease of control of reaction with the inorganic phosphorus compound (BI) and in terms of good gas barrier properties of the resulting multilayer structure, the compound (E) preferably includes at least one compound (Ea) represented by the following general formula [I].

$$Al(R^1)_k(R^2)_{3-k} \qquad [I]$$

In this formula, $R^1$ is a halogen atom (such as a fluorine atom, chlorine atom, bromine atom, or iodine atom), $NO_3$, an optionally substituted alkoxy group having 1 to 9 carbon atoms, an optionally substituted acyloxy group having 2 to 9 carbon atoms, an optionally substituted alkenyloxy group having 3 to 9 carbon atoms, an optionally substituted ß-diketonato group having 5 to 15 carbon atoms, or a diacylmethyl group having an optionally substituted acyl group having 1 to 9 carbon atoms. $R^2$ is an optionally substituted alkyl group having 1 to 9 carbon atoms, an optionally substituted aralkyl group having 7 to 10 carbon atoms, an optionally substituted alkenyl group having 2 to 9 carbon atoms, or an optionally substituted aryl group having 6 to 10 carbon atoms. k is an integer of 1 to 3. When there are two or more atoms or groups represented by $R^1$, the atoms or groups represented by $R^1$ may be the same as or different from each other. When there are two or more groups represented by $R^2$, the groups represented by $R^2$ may be the same as or different from each other.

The compound (E) may include, in addition to the compound (Ea), at least one compound (Eb) represented by the following general formula [II].

$$M^1(R^3)_m(R^4)_{n-m} \qquad [II]$$

In this formula, $M^1$ is at least one metal atom different from an aluminum atom and selected from atoms of metals belonging to Groups 2 to 14 of the periodic table. $R^3$ is a halogen atom (such as a fluorine atom, chlorine atom, bromine atom, or iodine atom), $NO_3$, an optionally substituted alkoxy group having 1 to 9 carbon atoms, an optionally substituted acyloxy group having 2 to 9 carbon atoms, an optionally substituted alkenyloxy group having 3 to 9 carbon atoms, an optionally substituted ß-diketonato group having 5 to 15 carbon atoms, or a diacylmethyl group having an optionally substituted acyl group having 1 to 9 carbon atoms. $R^4$ is an optionally substituted alkyl group having 1 to 9 carbon atoms, an optionally substituted aralkyl group having 7 to 10 carbon atoms, an optionally substituted alkenyl group having 2 to 9 carbon atoms, or an optionally substituted aryl group having 6 to 10 carbon atoms. m is an integer of 1 to n. n is equal to the valence of $M^1$. When there are two or more atoms or groups represented by $R^3$, the atoms or groups represented by $R^3$ may be the same as or different from each other. When there are two or more groups represented by $R^4$, the groups represented by $R^4$ may be the same as or different from each other.

Examples of the alkoxy groups represented by $R^1$ and $R^3$ include methoxy, ethoxy, n-propoxy, isopropoxy, n-butoxy, isobutoxy, sec-butoxy, tert-butoxy, benzyloxy, diphenylmethoxy, trityloxy, 4-methoxybenzyloxy, methoxymethoxy, 1-ethoxyethoxy, benzyloxymethoxy, 2-trimethylsilylethoxy, 2-trimethylsilylethoxymethoxy, phenoxy, and 4-methoxyphenoxy groups.

Examples of the acyloxy groups represented by $R^1$ and $R^3$ include acetoxy, ethylcarbonyloxy, n-propylcarbonyloxy, isopropylcarbonyloxy, n-butylcarbonyloxy, isobutylcarbonyloxy, sec-butylcarbonyloxy, tert-butylcarbonyloxy, and n-octylcarbonyloxy groups.

Examples of the alkenyloxy groups represented by $R^1$ and $R^3$ include allyloxy, 2-propenyloxy, 2-butenyloxy, 1-methyl-2-propenyloxy, 3-butenyloxy, 2-methyl-2-propenyloxy, 2-pentenyloxy, 3-pentenyloxy, 4-pentenyloxy, 1-methyl-3-butenyloxy, 1,2-dimethyl-2-propenyloxy, 1,1-dimethyl-2-propenyloxy, 2-methyl-2-butenyloxy, 3-methyl-2-butenyloxy, 2-methyl-3-butenyloxy, 3-methyl-3-butenyloxy, 1-vinyl-2-propenyloxy, and 5-hexenyloxy groups.

Examples of the ß-diketonato groups represented by $R^1$ and $R^3$ include 2,4-pentanedionato, 1,1,1-trifluoro-2,4-pentanedionato, 1,1,1,5,5,5-hexafluoro-2,4-pentanedionato, 2,2,6,6-tetramethyl-3,5-heptanedionato, 1,3-butanedionato, 2-methyl-1,3-butanedionato, 2-methyl-1,3-butanedionato, and benzoylacetonato groups.

Examples of the acyl groups of the diacylmethyl groups represented by $R^1$ and $R^3$ include: aliphatic acyl groups having 1 to 6 carbon atoms such as formyl, acetyl, propionyl (propanoyl), butyryl (butanoyl), valeryl (pentanoyl), and hexanoyl groups; and aromatic acyl (aroyl) groups such as benzoyl and toluoyl groups.

Examples of the alkyl groups represented by $R^2$ and $R^4$ include methyl, ethyl, n-propyl, isopropyl, n-butyl, isobutyl, sec-butyl, tert-butyl, n-pentyl, isopentyl, n-hexyl, isohexyl, 3-methylpentyl, 2-methylpentyl, 1,2-dimethylbutyl, cyclopropyl, cyclopentyl, and cyclohexyl groups.

Examples of the aralkyl groups represented by $R^2$ and $R^4$ include benzyl and phenylethyl (phenethyl) groups.

Examples of the alkenyl groups represented by $R^2$ and $R^4$ include vinyl, 1-propenyl, 2-propenyl, isopropenyl, 3-butenyl, 2-butenyl, 1-butenyl, 1-methyl-2-propenyl, 1-methyl-1-propenyl, 1-ethyl-1-ethenyl, 2-methyl-2-propenyl, 2-methyl-1-propenyl, 3-methyl-2-butenyl, and 4-pentenyl groups.

Examples of the aryl groups represented by $R^2$ and $R^4$ include phenyl, 1-naphthyl, and 2-naphthyl groups.

Examples of the substituents in $R^1$, $R^2$, $R^3$, and $R^4$ include: alkyl groups having 1 to 6 carbon atoms; alkoxy groups having 1 to 6 carbon atoms such as methoxy, ethoxy, n-propoxy, isopropoxy, n-butoxy, isobutoxy, sec-butoxy, tert-butoxy, n-pentyloxy, isopentyloxy, n-hexyloxy, cyclopropyloxy, cyclobutyloxy, cyclopentyloxy, and cyclohexyloxy groups; alkoxycarbonyl groups having 1 to 6 carbon atoms such as methoxycarbonyl, ethoxycarbonyl, n-propoxycarbonyl, isopropoxycarbonyl, n-butoxycarbonyl, isobutoxycarbonyl, sec-butoxycarbonyl, tert-butoxycarbonyl, n-pentyloxycarbonyl, isopentyloxycarbonyl, cyclopropyloxycarbonyl, cyclobutyloxycarbonyl, and cyclopentyloxycarbonyl groups; aromatic hydrocarbon groups such as phenyl, tolyl, and naphthyl groups; halogen atoms such as fluorine, chlorine, bromine, and iodine atoms; acyl groups having 1 to 6 carbon atoms; aralkyl groups having 7 to 10 carbon atoms; aralkyloxy groups having 7 to 10 carbon atoms; alkylamino groups having 1 to 6 carbon atoms; and dialkylamino groups having an alkyl group having 1 to 6 carbon atoms.

It is preferable for $R^1$ and $R^3$ to be a halogen atom, $NO_3$, an optionally substituted alkoxy group having 1 to 6 carbon atoms, an optionally substituted acyloxy group having 2 to 6 carbon atoms, an optionally substituted ß-diketonato group having 5 to 10 carbon atoms, or a diacylmethyl group having an optionally substituted acyl group having 1 to 6 carbon atoms, and it is more preferable for W and $R^3$ to be an optionally substituted alkoxy group having 1 to 6 carbon atoms.

It is preferable for $R^2$ and $R^4$ to be an optionally substituted alkyl group having 1 to 6 carbon atoms. It is preferable for k in the formula [I] to be 3.

It is preferable for $M^1$ to be an atom of a metal belonging to Group 4 of the periodic table, and it is more preferable for $M^1$ to be titanium or zirconium. When $M^1$ is an atom of a metal belonging to Group 4 of the periodic table, m in the formula [II] is preferably 4.

Boron and silicon are categorized herein as metals, although they may be classified as semimetals in other contexts.

Examples of the compound (Ea) include aluminum chloride, aluminum nitrate, aluminum acetate, tris(2,4-pentanedionato)aluminum, trimethoxyaluminum, triethoxyaluminum, tri-n-propoxyaluminum, triisopropoxyaluminum, tri-n-butoxyaluminum, tri-sec-butoxyaluminum, and tri-tert-butoxyaluminum. Among these, triisopropoxyaluminum and tri-sec-butoxyaluminum are preferred. One compound may be used alone as the compound (Ea) or a combination of two or more compounds may be used as the compound (Ea).

Examples of the compound (Eb) include: titanium compounds such as tetrakis(2,4-pentanedionato)titanium, tetramethoxytitanium, tetraethoxytitanium, tetraisopropoxytitanium, tetra-n-butoxytitanium, and tetrakis(2-ethylhexoxy)titanium; and zirconium compounds such as tetrakis(2,4-pentanedionato)zirconium, tetra-n-propoxyzirconium, and tetra-n-butoxyzirconium. One of these compounds may be used alone, or two or more of these compounds may be used in combination.

The proportion of the compound (Ea) in the total amount of the compound (E) is not particularly limited as long as the effect of the present invention is obtained. The proportion of the compound (e.g., the compound (Eb)) other than the compound (Ea) in the total amount of the compound (E) is preferably, for example, 20 mol % or less, more preferably 10 mol % or less, and even more preferably 5 mol % or less, and may be 0 mol %.

The compound (E) is hydrolyzed, so that at least some of the hydrolyzable characteristic groups of the compound (E) are converted to hydroxy groups. The hydrolysate is then condensed to form a compound in which the metal atoms (M) are linked together via an oxygen atom (O). The repetition of this condensation results in the formation of a compound that can be regarded substantially as a metal oxide. The thus formed metal oxide (Aa), in general, has hydroxy groups present on its surface.

A compound is categorized herein as the metal oxide (Aa) when the ratio, [the number of moles of the oxygen atoms (O) bonded only to the metal atoms (M)]/[the number of moles of the metal atoms (M)], is 0.8 or more in the compound. The "oxygen atom (O) bonded only to the metal atom (M)", as defined herein, refers to the oxygen atom (O) in the structure represented by M-O-M, and does not include an oxygen atom that is bonded to both the metal atom (M) and hydrogen atom (H) as is the case for the oxygen atom (O) in the structure represented by M-O—H. The above ratio in the metal oxide (Aa) is preferably 0.9 or more, more preferably 1.0 or more, and even more preferably 1.1 or more. The upper limit of this ratio is not particularly defined. When the valence of the metal atom (M) is denoted by n, the upper limit is typically expressed as n/2.

In order for the hydrolytic condensation to take place, it is important that the compound (E) has hydrolyzable characteristic groups. When there are no such groups bonded, hydrolytic condensation reaction does not occur or proceeds very slowly, which makes difficult the preparation of the metal oxide (Aa) intended.

The hydrolytic condensate of the compound (E) may be produced, for example, from a particular starting material by a technique employed in known sol-gel processes. As the starting material there can be used at least one selected from the group consisting of the compound (E), a partial hydrolysate of the compound (E), a complete hydrolysate of the compound (E), a compound formed by partial hydrolytic condensation of the compound (E), and a compound formed by condensation of a part of a complete hydrolysate of the compound (E).

The metal oxide (Aa) to be mixed with an inorganic phosphorus compound (BI)-containing material (the inorganic phosphorus compound (BI) itself or a composition containing the inorganic phosphorus compound (BI)) is preferably substantially free of phosphorus atoms.

[Compound (Ab)]

The reaction product (D) included in the compound (Ab) is obtained by a reaction between the metal oxide (Aa) and the inorganic phosphorus compound (BI). A compound formed by a reaction among the metal oxide (Aa), the inorganic phosphorus compound (BI), and another compound is also categorized as the reaction product (D). The compound (Ab) may partially include the metal oxide (Aa) and/or inorganic phosphorus compound (BI) that remains uninvolved in any reaction.

In the compound (Ab), the molar ratio between the metal atoms constituting the metal oxide (Aa) and the phosphorus atoms derived from the inorganic phosphorus compound (BI), as expressed by [metal atoms constituting metal oxide (Aa)]=[phosphorus atoms derived from inorganic phosphorus compound (BI)], is preferably 1.0:1.0 to 3.6:1.0 and more preferably 1.1:1.0 to 3.0:1.0. When the molar ratio is outside this range, the gas barrier performance is deteriorated. The molar ratio in the compound (Ab) can be controlled by adjusting the mixing ratio between the metal oxide (Aa) and the inorganic phosphorus compound (BI) in a coating liquid for forming the compound (Ab). The molar ratio in the compound (Ab) is typically equal to that in the coating liquid.

In an infrared absorption spectrum of the multilayer structure, a maximum absorption wavenumber in the region from 800 to 1,400 $cm^{-1}$ is preferably 1,080 to 1,130 $cm^{-1}$. In the process in which the metal oxide (Aa) and the inorganic phosphorus compound (BI) react to form the reaction product (D), a metal atom (M) derived from the metal oxide (Aa) and a phosphorus atom (P) derived from the inorganic phosphorus compound (BI) are linked via an oxygen atom (O) to form a bond represented by M-O—P. As a result, a characteristic absorption band attributed to this bond appears in an infrared absorption spectrum of the reaction product (D). A study by the present inventors has revealed that the resulting multilayer structure exhibits good gas barrier properties when the characteristic absorption band attributed to the M-O—P bond is observed in the region from 1,080 to 1,130 $cm^{-1}$. It has also been found that the resulting multilayer structure exhibits much better gas barrier properties particularly when the characteristic absorption band corresponds to the strongest absorption in the region from 800 to 1,400 $cm^{-1}$ where absorptions attributed to bonds between various atoms and oxygen atoms are generally observed.

By contrast, if a metal compound such as a metal alkoxide or metal salt and the inorganic phosphorus compound (BI) are first mixed together and the mixture is then subjected to hydrolytic condensation, the resulting product is a composite material in which the metal atoms derived from the metal compound and the phosphorus atoms derived from the inorganic phosphorus compound (BI) have been almost homogeneously mixed and reacted. In this case, in an infrared absorption spectrum of the composite material, the maximum absorption wavenumber in the region from 800 to 1,400 $cm^{-1}$ falls outside the range of 1,080 to 1,130 $cm^{-1}$.

In the infrared absorption spectrum of the multilayer structure, the width at half maximum of the maximum absorption band in the region from 800 to 1,400 $cm^{-1}$ is preferably 200 $cm^{-1}$ or less, more preferably 150 $cm^{-1}$ or less, even more preferably 100 $cm^{-1}$ or less, and particularly preferably 50 $cm^{-1}$ or less, in terms of the gas barrier properties of the resulting multilayer structure.

To obtain high barrier performance, an infrared absorption spectrum as measured for the layer (Y) alone preferably meets the value conditions as described above for the infrared absorption spectrum of the multilayer structure. The infrared absorption spectrum of the multilayer structure can be measured by the method described in "EXAMPLES" below. If the measurement is not possible by the method described in "EXAMPLES", the measurement may be conducted by another method, examples of which include, but are not limited to: reflection spectroscopy such as reflection absorption spectroscopy, external reflection spectroscopy, or attenuated total reflection spectroscopy; and transmission spectroscopy such as Nujol method or pellet method performed on the layer (Y) scraped from the multilayer structure.

[Inorganic Phosphorus Compound (BI)]

The inorganic phosphorus compound (BI) has a moiety capable of reacting with the metal oxide (Aa) and typically has a plurality of such moieties. It is preferable for the inorganic phosphorus compound (BI) to be a compound having 2 to 20 such moieties (atomic groups or functional groups). Examples of such moieties include a moiety capable of undergoing a condensation reaction with a functional group (e.g., hydroxy group) present on the surface of the metal oxide (Aa). Examples of such a moiety include a halogen atom bonded directly to a phosphorus atom and an oxygen atom bonded directly to a phosphorus atom. In general, the functional group (e.g., hydroxy group) present on the surface of the metal oxide (Aa) is bonded to the metal atom (M) constituting the metal oxide (Aa).

Examples of the inorganic phosphorus compound (BI) include: phosphorus oxoacids such as phosphoric acid, diphosphoric acid, triphosphoric acid, polyphosphoric acid formed by condensation of 4 or more molecules of phosphoric acid, phosphorous acid, phosphonic acid, phosphonous acid, phosphinic acid, and phosphinous acid; salts of these oxoacids (e.g., sodium phosphate); and derivatives of these oxoacids (e.g., halides such as phosphoryl chloride and dehydration products such as phosphorus pentoxide).

These inorganic phosphorus compounds (BI) may be used alone or in combination with one another. Among these inorganic phosphorus compounds (BI), phosphoric acid is preferably used alone or in combination with another inorganic phosphorus compound (BI). The use of phosphoric acid improves the stability of the coating liquid (S) described later and the gas barrier properties of the resulting multilayer structure. When phosphoric acid is used in combination with another inorganic phosphorus compound (BI), phosphoric acid preferably makes up 50 mol % or more of the total inorganic phosphorus compounds (BI).

[Inorganic Deposited Layer]

The multilayer structure may further include an inorganic deposited layer. The inorganic deposited layer can be formed by vapor deposition of an inorganic substance. Examples of the inorganic substance include metals (such as aluminum), metal oxides (such as silicon oxide and aluminum oxide), metal nitrides (such as silicon nitride), metal oxynitrides (such as silicon oxynitride), and metal carbonitrides (such as silicon carbonitride). Among these, aluminum oxide, silicon oxide, magnesium oxide, and silicon nitride are preferred, since an inorganic deposited layer formed of any of these substances has good barrier properties against oxygen or water vapor. The layer (Y) in the multilayer structure of the present invention may include an inorganic deposited layer containing aluminum. For example, the layer (Y) may include a deposited layer (Ac) of aluminum and/or a deposited layer (Ad) of aluminum oxide.

The method for forming the inorganic deposited layer is not particularly limited, and available methods include: physical vapor deposition processes such as vacuum vapor deposition (e.g., resistive heating vapor deposition, electron beam vapor deposition, molecular beam epitaxy, and ion plating) and sputtering (e.g., dual magnetron sputtering); and chemical vapor deposition processes such as thermal chemical vapor deposition (e.g., catalytic chemical vapor deposition), photochemical vapor deposition, plasma chemical vapor deposition (e.g., capacitively coupled plasma process, inductively coupled plasma process, surface wave plasma process, and electron cyclotron resonance plasma process), atomic layer deposition, and organometallic vapor deposition.

The thickness of the inorganic deposited layer is preferably 0.002 to 0.5 µm, more preferably 0.005 to 0.2 µm, and even more preferably 0.01 to 0.1 µm, although the preferred thickness depends on the type of the component of the inorganic deposited layer. A thickness at which good barrier properties or mechanical properties of the multilayer structure are achieved can be selected within the above range. If the thickness of the inorganic deposited layer is less than 0.002 µm, the inorganic deposited layer tends to have a low ability to repeatedly exhibit the barrier properties against oxygen or water vapor, and the inorganic deposited layer may fail to exhibit sufficient barrier properties. If the thickness of the inorganic deposited layer is more than 0.5 µm, the barrier properties of the inorganic deposited layer are likely to deteriorate when the multilayer structure is pulled or bent.

The thickness of the layer (Y) (or, for a multilayer structure including two or more layers (Y), the total thickness of the layers (Y)) is preferably 0.05 µm to 4.0 µm and more preferably 0.1 µm to 2.0 µm. Thinning the layer (Y) provides a reduction in the dimensional change of the multilayer structure during a process such as printing or lamination. The thickness of the layer (Y) can be measured by observing a cross-section of the multilayer structure with a scanning electron microscope or transmission electron microscope.

[Layer (Z)]

The layer (Z) contains an organic phosphorus compound (BO) and a polymer (F). The organic phosphorus compound (BO) is a compound containing a phosphorus atom. The polymer (F) is a polymer having an ether bond and having no glycosidic bond. The organic phosphorus compound (BO) and the polymer (F) will now be described.

[Organic Phosphorus Compound (BO)]

Examples of a phosphorus atom-containing functional group of the organic phosphorus compound (BO) include a phosphoric acid group, a phosphorous acid group, a phosphonic acid group, a phosphonous acid group, a phosphinic acid group, a phosphinous acid group, and functional groups derived from these groups (e.g., salts, (partial) esters, halides (such as chloride), and dehydration products). Among these, a phosphoric acid group and a phosphonic acid group are preferred, and a phosphonic acid group is more preferred.

It is preferable for the organic phosphorus compound (BO) to be a polymer (BOa) having the phosphorus atom-containing functional group. Examples of the polymer (BOa) include: polymers of phosphono(meth)acrylic acid ester compounds such as 6-[(2-phosphonoacetyl)oxy]hexyl acrylate, 2-phosphonooxyethyl methacrylate, phosphonomethyl methacrylate, 11-phosphonoundecyl methacrylate, and 1,1-diphosphonoethyl methacrylate; polymers of vinylphosphonic acid compounds such as vinylphosphonic acid, 2-propene-1-phosphonic acid, 4-vinylbenzylphosphonic acid, and 4-vinylphenylphosphonic acid; polymers of vinylphosphinic acid compounds such as vinylphosphinic acid and 4-vinylbenzylphosphinic acid; and phosphorylated starch. The polymer (BOa) may be a homopolymer of a monomer having at least one phosphorus atom-containing functional group or may be a copolymer of two or more monomers. Alternatively, a combination of two or more polymers each formed from a single monomer may be used as the polymer (BOa). In particular, a polymer of a phosphono(meth)acrylic acid ester compound and a polymer of a vinylphosphonic acid compound are preferred, and a polymer of a vinylphosphonic acid compound is more preferred. Poly(vinylphosphonic acid) is particularly preferred as the polymer (BOa). The polymer (BOa) can be obtained also by homopolymerization or copolymerization of a vinylphosphonic acid derivative such as a vinylphosphonic acid halide or vinylphosphonic acid ester, followed by hydrolysis.

Alternatively, the polymer (BOa) may be a copolymer of a monomer having at least one phosphorus atom-containing functional group and another vinyl monomer. Examples of the other vinyl monomer copolymerizable with the monomer having the phosphorus atom-containing functional group include (meth)acrylic acid, (meth)acrylic acid esters, (meth)acrylonitrile, styrene, nuclear-substituted styrenes, alkyl vinyl ethers, alkyl vinyl esters, perfluoroalkyl vinyl ethers, perfluoroalkyl vinyl esters, maleic acid, maleic anhydride, fumaric acid, itaconic acid, maleimide, and phenylmaleimide. Among these, (meth)acrylic acid esters, acrylonitrile, styrene, maleimide, and phenylmaleimide are preferred.

In order to obtain a multilayer structure that has higher bending resistance, the proportion of the structural units derived from the monomer having the phosphorus atom-containing functional group in the total structural units of the polymer (BOa) is preferably 10 mol % or more, more preferably 20 mol % or more, even more preferably 40 mol % or more, and particularly preferably 70 mol % or more, and may be 100 mol %.

The molecular weight of the polymer (BOa) is not particularly limited, but is preferably such that the number-average molecular weight is in the range of 1,000 to 100,000. When the number-average molecular weight is in this range, both a high level of improving effect of stacking of the layer (Z) on bending resistance and a high level of viscosity stability of a coating liquid (T) described later can be achieved.

[Polymer (F) Having Ether Bond and Having No Glycosidic Bond]

The multilayer structure of the present invention retains good interlayer adhesion (peel strength) after retorting by virtue of the polymer (F) being incorporated in the layer (Z). The incorporation of the polymer (F) can also prevent coloring of the multilayer structure of the present invention to enhance the transparency of the multilayer structure, thus enabling the multilayer structure to have good appearance. Furthermore, since the polymer (F) has an ether bond which has high affinity to a member(s) (e.g., an adhesive layer (I) or an additional layer (J) such as an ink layer) other than the layer (Z), the adhesion of the layer (Z) to another layer is enhanced so that the interlayer adhesion can be maintained after retorting. This makes it possible to prevent appearance defects such as delamination. The polymer (F) is not particularly limited, and may be any polymer having an ether bond and having no glycosidic bond. The "glycosidic bond" refers to a bond between hemiacetal of a monosaccharide (or a monosaccharide derivative) and a hydroxy group of an organic compound such as an alcohol. Preferred examples of the polymer (F) include polyoxyalkylene polymers. Preferred among polyoxyalkylene polymers is a polymer (Fa) having a repeating unit represented by the following general formula [III].

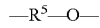    [III]

In this formula, $R^5$ is an optionally substituted, linear or branched alkylene group having 1 to 14 carbon atoms.

The linear or branched alkylene group represented by $R^5$ in the general formula [III] is preferably an alkylene group having 1 to 9 carbon atoms, more preferably an alkylene group having 2 to 6 carbon atoms, even more preferably an alkylene group having 2 to 4 carbon atoms, and particularly preferably an alkylene group having 2 to 3 carbon atoms. Examples of the alkylene group include methylene, ethylene, propylene, trimethylene, tetramethylene, 2,2-dimethyltrimethylene, hexamethylene, and octamethylene groups. The substituent in the alkylene group is preferably a linear or branched alkyl group having 1 to 6 carbon atoms. Examples of the repeating unit of the general formula [III] include the following units:

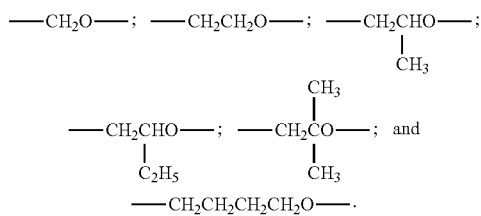

More preferred as the polyoxyalkylene polymer (Fa) described above is a polyalkylene glycol polymer (Fb) having a repeating unit represented by the general formula [III]. The alkylene group of the polyalkylene glycol polymer (Fb) is the same as defined for the general formula [III] representing the repeating unit of the polyoxyalkylene polymer (Fa).

Examples of the polymer (F) include polyoxymethylene, polyethylene glycol, polyethylene oxide, polypropylene glycol, polypropylene oxide, polyoxyethylene polyoxypropylene glycol, and polytetramethylene ether glycol. Preferred among these are polyalkylene glycol polymers having an alkylene group having 2 to 4 carbon atoms such as polyethylene glycol, polyethylene oxide, polypropylene glycol, polypropylene oxide, and polyoxyethylene polyoxypropylene glycol. More preferred are polyethylene glycol, polyethylene oxide, polypropylene glycol, and polypropylene oxide, and even more preferred are polyethylene glycol and polyethylene oxide.

The polymer (F) may be a homopolymer of a monomer (e.g., ethylene glycol or tetrahydrofuran) or a copolymer of two or more monomers. A combination of two or more polymers (F) may be used as the polymer (F). The polymer (F) may have capped terminal hydroxy groups. Examples of the polymer (F) having capped terminal hydroxy groups include monomethyl polyoxymethylene, monomethyl polyethylene glycol, monomethyl polypropylene glycol, monomethyl polytetramethylene ether glycol, dimethyl polyoxymethylene, dimethyl polyethylene glycol, dimethyl polypropylene glycol, and dimethyl polytetramethylene ether glycol.

The molecular weight of the polymer (F) is not particularly limited. To obtain a multilayer structure that maintains good cohesion after retorting, the weight-average molecular weight (Mw) of the polymer (F) is preferably, but not limited to, 5,000 or more. The weight-average molecular weight is more preferably 8,000 or more and even more preferably 10,000 or more. The weight-average molecular weight is preferably 7,000,000 or less, more preferably 3,500,000 or less, even more preferably 1,000,000 or less, and particularly preferably 100,000 or less. If the weight-average molecular weight is outside the above range, sufficient cohesion may not be achieved. Examples of the method for measuring the weight-average molecular weight include, but are not limited to, a viscometric method, light scattering method, and gel permeation chromatography (GPC).

The layer (Z) included in the multilayer structure of the present invention may consist only of the organic phosphorus compound (BO) and the polymer (F). The layer (Z) may further contain an additional component other than the organic phosphorus compound (BO) and polymer (F). Examples of the additional component that may be contained in the layer (Z) include: metal salts of inorganic acids such as a metal carbonate, a metal hydrochloride, a metal nitrate, a metal hydrogen carbonate, a metal sulfate, a metal hydrogen sulfate, and a metal borate; metal salts of organic acids such as a metal oxalate, a metal acetate, a metal tartrate, and a metal stearate; metal complexes such as a cyclopentadienyl metal complex (e.g., titanocene) and a cyanometal complex (e.g., Prussian blue); layered clay compounds; crosslinkers; polymer compounds other than the organic phosphorus compound (BO) and polymer (F); plasticizers; antioxidants; ultraviolet absorbers; and flame retardants. The content of the additional component in the layer (Z) of the multilayer structure is preferably 50 mass % or less, more preferably 20 mass % or less, even more preferably 10 mass % or less, and particularly preferably 5 mass % or less, and may be 0 mass % (which means that the additional component is not contained).

The mass ratio between the organic phosphorus compound (BO) and the polymer (F) is preferably 30:70 to 99:1 and more preferably 40:60 to 95:5. In terms of further reducing the deterioration of barrier performance caused by retorting and stretching, the mass ratio is even more preferably 50:50 to 91:9. The polymer (F) may or may not react with a component in the layer (Y).

When the layer (Y) and layer (Z) of the multilayer structure contain the inorganic phosphorus compound (BI) and the organic phosphorus compound (BO), respectively, the mass ratio $W_{BO}/W_{BI}$ between the mass $W_{BI}$ of the inorganic phosphorus compound (BI) in the layer (Y) and the mass $W_{BO}$ of the organic phosphorus compound (BO) in the layer (Z) is preferably 0.06 or more. In terms of achieving higher stretching resistance, the mass ratio $W_{BO}/W_{BI}$ is more preferably 0.07 or more, even more preferably 0.09 or more, particularly preferably 0.19 or more, more particularly preferably 0.21 or more, and most preferably 0.31 or more. The mass ratio $W_{BO}/W_{BI}$ may be 10.0 or less, 5.0 or less, 2.0 or less, 1.0 or less, or 0.90 or less.

The thickness of the layer (Z) is preferably 0.003 µm or more and more preferably 0.03 µm to 1.0 µm. When the thickness of the layer (Z) is in this range, both retorting resistance and stress resistance (in particular, resistance to physical stresses such as that caused by stretching) can be achieved. The thickness of the layer (Z) can be measured by observing a cross-section of the multilayer structure with a scanning electron microscope or transmission electron microscope.

[Method for Producing Multilayer Structure]

The features described for the multilayer structure of the present invention can be applied to the production method of the present invention and may not be described repeatedly. The features described for the production method of the present invention can be applied to the multilayer structure of the present invention.

An example of the method for producing the multilayer structure according to the present invention is a production method including the steps of: (i) forming a precursor layer of the layer (Y) on the base (X); (ii) applying a coating liquid (T) containing the polymer (F) and organic phosphorus compound (BO); and (iii) forming the layer (Y) and layer (Z). The compound (A), the inorganic phosphorus compound (BI), the organic phosphorus compound (BO), and the mass ratio between them are as previously described, and will not be repeatedly described for the production method.

[Step (i)]

In the step (i), a coating liquid (S) containing the aluminum-containing compound (A) is applied onto the base (X) to form a precursor layer of the layer (Y) on the base (X). The step (i) results in a structure including the base (X) and the precursor layer of the layer (Y). When the layer (Y) should contain a deposited layer (Ac) of aluminum or a deposited layer (Ad) of aluminum oxide, such a deposited layer can be formed by any of the common vapor deposition processes mentioned above. Thus, the following will give a detailed description of a method for forming a precursor layer of a layer (Y1) containing the compound (Ab).

In a preferred embodiment, the coating liquid (S) (first coating liquid) is obtained by mixing the metal oxide (Aa) and the inorganic phosphorus compound (BI) in a solvent to cause a reaction. Specifically, the coating liquid (5) can be prepared, for example, by a method in which a dispersion of the metal oxide (Aa) and a solution of the inorganic phosphorus compound (BI) are mixed or by a method in which the inorganic phosphorus compound (BI) is added to and mixed with a dispersion of the metal oxide (Aa). The temperature during the mixing is preferably 50° C. or lower, more preferably 30° C. or lower, and even more preferably 20° C. or lower. The coating liquid (S) may contain another compound and may, if desired, contain at least one acid compound (Q) selected from the group consisting of acetic acid, hydrochloric acid, nitric acid, trifluoroacetic acid, and trichloroacetic acid.

The dispersion of the metal oxide (Aa) can be prepared, for example, by mixing the compound (E), water, and optionally an acid catalyst or organic solvent and allowing the compound (E) to undergo condensation or hydrolytic condensation according to procedures employed in known sol-gel processes. When the dispersion of the metal oxide (Aa) is obtained by condensation or hydrolytic condensation of the compound (E), the dispersion obtained may, if desired, be subjected to a certain process (such as deflocculation in the presence of the acid compound (Q)). The solvent used is preferably, but not limited to, an alcohol such as methanol, ethanol, or isopropanol, water, or a mixed solvent thereof.

The solution containing the inorganic phosphorus compound (BI) can be prepared by dissolving the inorganic phosphorus compound (BI) in a solvent. The solvent can be selected as appropriate depending on the type of the inorganic phosphorus compound (BI), and preferably contains water. The solvent may contain an organic solvent (e.g., an alcohol such as methanol) as long as the organic solvent does not hinder the dissolution of the inorganic phosphorus compound (BI).

The solids concentration in the coating liquid (S) is preferably 1 to 20 mass %, more preferably 2 to 15 mass %, and even more preferably 3 to 10 mass %, in terms of the storage stability of the coating liquid and the quality of application of the coating liquid onto the base (X). The solids concentration can be determined, for example, by distilling off the solvent from the coating liquid (S) and dividing the mass of the remaining solids by the initial mass of the coating liquid (S) yet to be subjected to the distillation.

The viscosity of the coating liquid (S) is preferably 3,000 mPa·s or less, more preferably 2,500 mPa·s or less, and even more preferably 2,000 mPa·s or less, as measured with a Brookfield rotary viscometer (SB-type viscometer: rotor No. 3, rotational speed=60 rpm) at a temperature at which the coating liquid (S) is applied. Controlling the viscosity to 3,000 mPa·s or less improves the leveling of the coating liquid (S), thus allowing the resulting multilayer structure to have better appearance. The viscosity of the coating liquid (S) is preferably 50 mPa·s or more, more preferably 100 mPa·s or more, and even more preferably 200 mPa·s or more.

The molar ratio between aluminum atoms and phosphorus atoms in the coating liquid (S), as expressed by [aluminum atoms]:[phosphorus atoms], is preferably, but not limited to, 1.01:1.00 to 1.50:1.00 and more preferably 1.05:1.00 to 1.45:1.00. The molar ratio between aluminum atoms and phosphorus atoms can be determined by fluorescent X-ray analysis of a solid obtained by drying the coating liquid (S).

The coating liquid (S) may be applied directly onto at least one surface of the base (X) or applied onto the base (X) with an additional layer (J) interposed therebetween. An adhesive layer (I) may be formed on a surface of the base (X) by treating the surface of the base (X) with a known anchor coating agent or applying a known adhesive onto the surface of the base (X) before application of the coating liquid (S).

The method for application of the coating liquid (S) is not particularly limited, and any known method can be employed. Examples of the method for application include casting, clipping, roll coating, gravure coating, screen printing, reverse coating, spray coating, kiss coating, die coating, metering bar coating, chamber doctor-using coating, curtain coating, and bar coating.

In the step (i), the precursor layer of the layer (Y1) is formed typically by removing the solvent from the coating liquid (S). The method for removing the solvent is not particularly limited, and any known drying method can be employed. Examples of the drying method include hot air drying, hot roll contact drying, infrared heating, and microwave heating. The drying temperature is preferably equal to or lower than the onset temperature of fluidization of the base (X). The temperature employed for drying the applied coating liquid (S) may be, for example, around 80 to 180° C. or around 90 to 150° C. The drying time is preferably, but not limited to, 0.1 seconds to 1 hour, more preferably 1 second to 15 minutes, and even more preferably 5 to 300 seconds, for example. The drying is preferably followed by heat treatment. The heat treatment temperature may be, for example, around 100 to 200° C. or around 120 to 180° C., and is preferably higher than the drying temperature. The heat treatment time is preferably, but not limited to, 1 second to 1 hour, more preferably 1 second to 15 minutes, and even more preferably 5 to 300 seconds, for example. Such heat treatment prior to application of the coating liquid (T) containing the organic phosphorus compound (BO) is preferred to obtain a multilayer structure having good properties.

[Step (ii)]

In the step (ii), the coating liquid (T) (second coating liquid) containing the polymer (F) and organic phosphorus compound (BO) is applied onto that precursor layer of the layer (Y1) which has been obtained in the step (i). The coating liquid (T) can be prepared by mixing the polymer (F), the organic phosphorus compound (BO), and a solvent. The solvent used can be selected as appropriate depending on the type of the organic phosphorus compound (BO) and is preferably, but not limited to, an alcohol such as methanol, ethanol, or isopropanol, water, or a mixed solvent thereof.

The solids concentration in the coating liquid (T) is preferably 0.01 to 60 mass %, more preferably 0.1 to 50 mass %, and even more preferably 0.2 to 40 mass % in terms of the storage stability or quality of application of the liquid. The solids concentration can be determined by the same method as described for the coating liquid (S). The coating liquid (T) may contain other component(s) (e.g., a polymer compound other than the organic phosphorus compound (BO) and polymer (F)) as long as the effect of the present invention is obtained.

The application of the coating liquid (T) is followed by removal of the solvent, resulting in the formation of a precursor layer of the layer (Z). As is the case for application of the coating liquid (S), the method for applying the coating liquid (T) is not particularly limited, and any known method can be employed. When the inorganic phosphorus compound (BI) is used, it is particularly preferable, in terms of high barrier performance, in particular high stretching resistance, to adjust the amount of the coating liquid (T) to be applied so that the mass ratio $W_{BO}/W_{BI}$ between the mass $W_{BI}$ of the inorganic phosphorus compound (BI) and the mass $W_{BO}$ of the organic phosphorus compound (BO) satisfies the predetermined condition described above.

The method for removing the solvent from the coating liquid (T) is not particularly limited, and any known drying method can be employed. Examples of the drying method include hot air drying, hot roll contact drying, infrared heating, and microwave heating. The drying temperature is preferably equal to or lower than the onset temperature of fluidization of the base (X). The temperature employed for drying the applied coating liquid (T) may be, for example, around 90 to 240° C., and is preferably 100 to 200° C.

[Step (iii)]

In the step the precursor layers formed in the steps (i) and (ii) are heat-treated at a temperature of 140° C. or higher to form the layer (Y1) and layer (Z). The heat treatment temperature is preferably higher than the temperature employed for drying the applied coating liquid (T).

In the step a reaction takes place in which particles of the metal oxide (Aa) are bonded together via phosphorus atoms (phosphorus atoms derived from the inorganic phosphorus compound (BI)). From another standpoint, a reaction of formation of the reaction product (D) takes place in the step (iii). To allow the reaction to take place to a sufficient extent, the heat treatment temperature is 140° C. or higher, preferably 170° C. or higher, more preferably 180° C. or higher, and even more preferably 190° C. or higher. The upper limit of the heat treatment temperature is preferably, but not limited to, 300° C. or lower. A lowered heat treatment temperature increases the time required to achieve a sufficient reaction rate, thereby causing a reduction in production efficiency. The preferred upper limit of the heat treatment temperature depends on, for example, the type of the base (X). For example, when a thermoplastic resin film made of polyamide resin is used as the base (X), the heat treatment temperature is preferably 270° C. or lower. When a thermoplastic resin film made of polyester resin is used as the base (X), the heat treatment temperature is preferably 240° C. or lower. The heat treatment may be carried out, for example, in an air atmosphere, nitrogen atmosphere, or argon atmosphere. The heat treatment time is preferably 0.1 seconds to 1 hour, more preferably 1 second to 15 minutes, and even more preferably 5 to 300 seconds.

In a preferred embodiment of the method for producing a multilayer structure according to the present invention, the application of the coating liquid (S) is followed by drying (first drying) and then by heat treatment (first heat treatment) to form a precursor layer in the step (i), the application of the coating liquid (T) is followed by drying (second drying) in the step (ii), and then heat treatment (second heat treatment) is carried out in the step (iii). It is preferable that the temperature of the first heat treatment be higher than the temperature of the first drying, the temperature of the second heat treatment be higher than the temperature of the second drying, and the temperature of the second heat treatment be higher than the temperature of the first heat treatment.

In the multilayer structure of the present invention, the layer (Y) and/or layer (Z) may be stacked in direct contact with the base (X). Alternatively, the layer (Y) and/or layer (Z) may be stacked over the base (X), with other member(s) (e.g., an adhesive layer (I) or additional layer (J)) interposed therebetween. When the layer (Y) and/or layer (Z) is in direct contact with the base (X), the multilayer structure may, for example, include the base (X), the layer (Y) stacked on the base (X), and the layer (Z) stacked on the layer (Y).

[Extrusion coating lamination]

The multilayer structure of the present invention can further include a layer formed by extrusion coating lamination; for example, after the layer (Y) and/or layer (Z) is stacked on the base (X) directly or with the adhesive layer (I) interposed therebetween, the additional layer (J) may be formed by extrusion coating lamination on the layer (Y) and/or layer (Z) directly or with the adhesive layer (I) interposed therebetween. The extrusion coating lamination method that may be used in the present invention is not particularly limited, and any known method can be used. In a typical method for extrusion coating lamination, a molten thermoplastic resin is fed to a T-die, and the thermoplastic resin is extruded through a flat slit of the T-die and then cooled to produce a laminated film.

Figure 5:
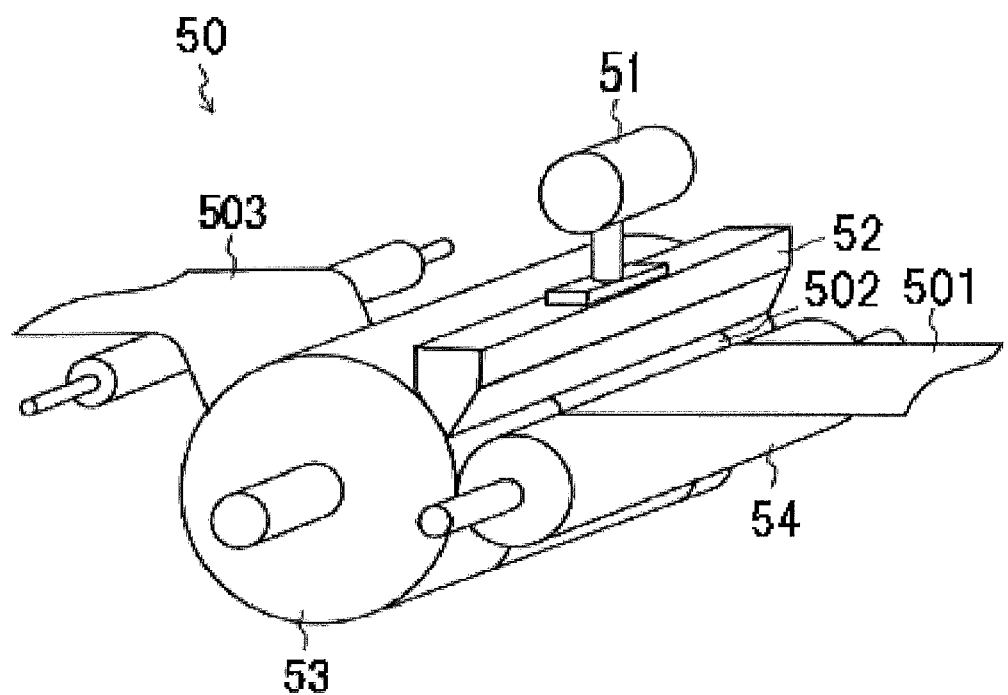
FIG. 5 is a perspective view schematically showing a part of an extrusion coating lamination apparatus used for producing a multilayer structure according to an embodiment of the present invention.

An example of single lamination, which is the most common method for extrusion coating lamination, will now be described with reference to the drawings. An exemplary apparatus used in single lamination is shown in FIG. 5. FIG. 5 schematically shows only a key part of the apparatus, and actual apparatuses are different from that shown in FIG. 5. The apparatus 50 of FIG. 5 includes an extruder 51, a T-die 52, a cooling roll 53, and a rubber roll 54. The cooling roll 53 and the rubber roll 54 are arranged in such a manner that their roll surfaces are in contact with each other.

A thermoplastic resin is heated and melted in the extruder, and then extruded through the flat slit of the T-die 52 into a resin film 502. Meanwhile, a layered product 501 is delivered from a sheet feeder (not shown) and is pressed, together with the resin film 502, between the cooling roll 53 and the rubber roll 54. The layered product 501 and the resin film 502, stacked on each other, are pressed together between the cooling roll 53 and the rubber roll 54 to produce a laminated film (multilayer structure) 503 including the layered product 501 and the resin film 502 united together. The layered structure 501 may include the base (X), the layer (Y), and the layer (Z).

Examples of the method for extrusion coating lamination other than the above single lamination include sandwich lamination and tandem lamination. The sandwich lamination is a method for producing a layered product by extruding a molten thermoplastic resin onto a first base supplied from an unwinder (feed roll) and bonding the extruded thermoplastic rein to a second base supplied from another unwinder. The tandem lamination is a method for producing a layered product consisting of five layers at a time by using two single-lamination machines connected together.

The use of the layered product described above allows production of a multilayer structure that maintains high barrier performance and experiences little decrease in light transmittance even after extrusion coating lamination.

[Adhesive layer (I)]

In the multilayer structure of the present invention, the adhesion between the base (X) and the layer (Y) and/or layer (Z) can be enhanced by means of the adhesive layer (I). The adhesive layer (I) may be made of an adhesive resin. The adhesive layer (I) made of an adhesive resin can be formed by treating a surface of the base (X) with a known anchor coating agent or applying a known adhesive to the surface of the base (X). The adhesive is preferably a two-component reactive polyurethane adhesive including a polyisocyanate component and a polyol component which are to be mixed and reacted. Addition of a small amount of an additive such as a known silane coupling agent to the anchor coating agent or adhesive may further enhance the adhesion. Examples of the silane coupling agent include, but are not limited to, silane coupling agents having a reactive group such as an isocyanate, epoxy, amino, ureido, or mercapto group. Strong adhesion between the base (X) and the layer (Y) and/or layer (Z) via the adhesive layer (I) makes it possible to effectively prevent deterioration in the gas barrier properties or appearance of the multilayer structure of the present invention when the multilayer structure is subjected to a process such as printing or lamination, and also makes it possible to increase the drop impact resistance of a packaging material inducing the multilayer structure of the present invention. The thickness of the adhesive layer (I) is preferably 0.01 to 10.0 µm and more preferably 0.03 to 5.0 µm.

[Additional layer (J)]

The multilayer structure of the present invention may further include the additional layer (J) for imparting various properties (such as heat sealing properties, barrier properties, and mechanical properties). The multilayer structure of the present invention that includes the additional layer (J) can be produced, for example, by stacking the layer (Y) and/or layer (Z) on the base (X) directly or with the adhesive layer (I) interposed therebetween and then by attaching or forming the additional layer (J) on the layer (Y) anchor layer (Z) directly or with the adhesive layer (I) interposed therebetween. Examples of the additional layer (J) include, but are not limited to, ink layers and thermoplastic resin layers such as a polyolefin layer and an ethylene-vinyl alcohol copolymer resin layer.

The multilayer structure of the present invention may include an ink layer on which a product name, decorative pattern, or the like is to be printed. Examples of the ink layer include a film resulting from drying of a liquid prepared by dispersing a polyurethane resin containing a pigment (e.g., titanium dioxide) in a solvent. The ink layer may be a film resulting from drying of an ink or electronic circuit-forming resist containing a polyurethane resin free of any pigment or another resin as a main component. Methods for applying the ink layer include gravure printing and various coating methods using a wire bar, a spin coater, or a die coater. The thickness of the ink layer is preferably 0.5 to 10.0 µm and more preferably 1.0 to 4.0 µm.

Placing a polyolefin layer as an outermost layer of the multilayer structure of the present invention can impart heat-sealing properties to the multilayer structure or improve the mechanical characteristics of the multilayer structure. In terms of, for example, the impartation of heat-sealing properties and the improvement in mechanical characteristics, the polyolefin is preferably polypropylene or polyethylene. It is also preferable to stack at least one film selected from the group consisting of a film made of a polyester, a film made of a polyamide, and a film made of a hydroxy group-containing polymer, in order to improve the mechanical characteristics of the multilayer structure. In terms of the improvement in mechanical characteristics, the polyester is preferably polyethylene terephthalate, the polyamide is preferably nylon-6, and the hydroxy group-containing polymer is preferably ethylene-vinyl alcohol copolymer. Between the layers there may, if desired, be provided an anchor coat layer or a layer made of an adhesive.

[Configuration of multilayer structure]

Specific examples of the configuration of the multilayer structure of the present invention are listed below. The multilayer structure may include a member(s) (e.g., the adhesive layer (I) or additional layer (J)) other than the base (X) layer (Y), and layer (Z); however, the other member(s) is omitted in the following list of specific examples. The multilayer structures listed below as specific examples may be stacked on top of each other or combined with each other. A structure made up of the layer (Y) and layer (Z) stacked contiguous to each other may hereinafter be referred to as a "layer (YZ)". In the layer (YZ), the layer (Y) and layer (Z) may be stacked in either order.

(1) Layer (YZ)/polyester layer,
(2) Layer (YZ)/polyester layer/layer (YZ),
(3) Layer (YZ)/polyamide layer,
(4) Layer (YZ)/polyamide layer/layer (YZ),
(5) Layer (YZ)/polyolefin layer,
(6) Layer (YZ)/polyolefin layer/layer (YZ),
(7) Layer (YZ)/hydroxy group-containing polymer layer,
(8) Layer (YZ)/hydroxy group-containing polymer layer/layer (YZ),
(9) Layer (YZ)/paper layer,
(10) Layer (YZ)/paper layer/layer (YZ),
(11) Layer (YZ)/inorganic deposited layer/polyester layer,
(12) Layer (YZ)/inorganic deposited layer/polyamide layer,
(13) Layer (YZ)/inorganic deposited layer/polyolefin layer,
(14) Layer (YZ)/inorganic deposited layer/hydroxy group-containing polymer layer,
(15) Layer (YZ)/polyester layer/polyamide layer/polyolefin layer,
(16) Layer (YZ)/polyester layer/layer (YZ)/polyamide layer/polyolefin layer,
(17) Polyester layer/layer (YZ)/polyester layer/layer (YZ)/inorganic deposited layer/hydroxy group-containing polymer layer/polyolefin layer,
(18) Polyester layer/layer (YZ)/polyamide layer/polyolefin layer,
(19) Layer (YZ)/polyamide layer/polyester layer/polyolefin layer,
(20) Layer (YZ)/polyamide layer/layer (YZ)/polyester layer/polyolefin layer,
(21) Polyamide layer/layer (YZ)/polyester layer/polyolefin layer,
(22) Layer (YZ)/polyolefin layer/polyamide layer/polyolefin layer,
(23) Layer (YZ)/polyolefin layer/layer (YZ)/polyamide layer/polyolefin layer,
(24) Polyolefin layer/layer (YZ)/polyamide layer/polyolefin layer,
(25) Layer (YZ)/polyolefin layer/polyolefin layer,
(26) Layer (YZ)/polyolefin layer/layer (YZ)/polyolefin layer,
(27) Polyolefin layer/layer (YZ)/polyolefin layer,
(28) Layer (YZ)/polyester layer/polyolefin layer,
(29) Layer (YZ)/polyester layer/layer (YZ)/polyolefin layer,
(30) Polyester layer/layer (YZ)/polyolefin layer,
(31) Layer (YZ)/polyamide layer/polyolefin layer,
(32) Layer (YZ)/polyamide layer/layer (YZ)/polyolefin layer,
(33) Polyamide layer/layer (YZ)/polyolefin layer,
(34) Layer (YZ)/polyester layer/paper layer,
(35) Layer (YZ)/polyamide layer/paper layer,
(36) Layer (YZ)/polyolefin layer/paper layer,
(37) Polyolefin layer/paper layer/polyolefin layer/layer (YZ)/polyester layer/polyolefin layer,
(38) Polyolefin layer/paper layer/polyolefin layer/layer (YZ)/polyamide layer/polyolefin layer,
(39) Polyolefin layer/paper layer/polyolefin layer/layer (YZ)/polyolefin layer,
(40) Paper layer/polyolefin layer/layer (YZ)/polyester layer/polyolefin layer,
(41) Polyolefin layer/paper layer/layer (YZ)/polyolefin layer,
(42) Paper layer/layer (YZ)/polyester layer/polyolefin layer,
(43) Paper layer/layer (YZ)/polyolefin layer,
(44) Layer (YZ)/paper layer/polyolefin layer,
(45) Layer (YZ)/polyester layer/paper layer/polyolefin layer,
(46) Polyolefin layer/paper layer/polyolefin layer/layer (YZ)/polyolefin layer/hydroxy group-containing polymer layer,
(47) Polyolefin layer/paper layer/polyolefin layer/layer (YZ)/polyolefin layer/polyamide layer,
(48) Polyolefin layer/paper layer/polyolefin layer/layer (YZ)/polyolefin layer/polyester layer,
(49) Inorganic deposited layer/layer (YZ)/polyester layer,
(50) Inorganic deposited layer/layer (YZ)/polyester layer/layer (YZ)/inorganic deposited layer,
(51) Inorganic deposited layer/layer (YZ)/polyamide layer,
(52) Inorganic deposited layer/layer (YZ)/polyamide layer/layer (YZ)/inorganic deposited layer,
(53) Inorganic deposited layer/layer (YZ)/polyolefin layer,
(54) Inorganic deposited layer/layer (YZ)/polyolefin layer/layer (YZ)/inorganic deposited layer Among the above configurations, any of the configurations (1) to (8), (11) to (33), and (49) to (54) is preferred for the protective sheet of the present invention.

The multilayer structure of the present invention preferably has an oxygen transmission rate of 2.0 mL/(m²·day·atm) or less, more preferably 0.50 mL/(m²·day·atm) or less, even more preferably 0.30 mL/(m²·day·atm) or less, at 20° C. and 85% RH before and after retorting. The conditions of the retorting, and the method and conditions of measurement of the oxygen transmission rate, are as described in "EXAMPLES" below.

The multilayer structure of the present invention preferably has a moisture permeability of 0.5 g/(m²·day) or less, more preferably 0.3 g/(m²·day) or less, at 40° C. and 90% RH before and after retorting. The conditions of the retorting, and the method and conditions of measurement of the moisture permeability, are as described in "EXAMPLES" below.

The multilayer structure of the present invention is preferably configured so that a peel strength between the layer (Y) or layer (Z) and the adhesive layer (I) or additional layer (J) (e.g., the ink layer) is more than 160 g/15 mm, more preferably 200 g/15 mm or more, even more preferably 300 g/15 mm or more, and particularly preferably 400 g/15 mm or more after retorting. The conditions of the retorting, and the method and conditions of measurement of the peel strength, are as described in "EXAMPLES" below.

The multilayer structure and protective sheet of the present invention preferably have an oxygen transmission rate of 2.0 mL/(m²·day·atm) or less, more preferably 0.50 mL/(m²·day·atm) or less, even more preferably 0.30 mL/(m²·day·atm) or less, at 20° C. and 85% RH before and after a damp heat test. The conditions of the damp heat test, and the method and conditions of measurement of the oxygen transmission rate, are as described in "EXAMPLES" below.

The multilayer structure and protective sheet of the present invention preferably have a moisture permeability of 0.5 g/(m²·day) or less, more preferably 0.3 g/(m²·day) or less, at 40° C. and 90% RH before and after a damp heat test. The conditions of the damp heat test, and the method and conditions of measurement of the moisture permeability, are as described in "EXAMPLES" below.

Applications

The multilayer structure of the present invention and a packaging material including the multilayer structure have good gas barrier properties and good water vapor barrier properties and also have such high retort resistance and stretching resistance that the multilayer structure and packaging material retain good interlayer adhesion (peel strength) without suffering from appearance defect such as delamination. Thus, the multilayer structure of the present invention and the packaging material including the multilayer structure can be used in various applications.

[Packaging Material]

The packaging material of the present invention includes a multilayer structure including a base (X) and layers (Y) and (Z) that are stacked over the base (X). The packaging material may consist of the multilayer structure. That is, in the following description, the term "packaging material" may be interchanged with the term "multilayer structure". In addition, the term "packaging material" is typically interchangeable with the term "package". The packaging material may include the multilayer structure and another member.

The packaging material according to a preferred embodiment of the present invention has barrier properties against inorganic gases (such as hydrogen, helium, nitrogen, oxygen, and carbon dioxide), natural gases, water vapor, and organic compounds that are liquid at ordinary temperature and pressure (such as ethanol and gasoline vapor).

When the packaging material of the present invention is in the form of a packaging bag, the multilayer structure may be used over the entirety of the packaging bag or the multilayer structure may be included in a part of the packaging bag. For example, the multilayer structure may constitute 50% to 100% of the overall area of the packaging bag. The same applies to the case where the packaging material is in a form other than a packaging bag (a container or lid, for example).

The packaging material of the present invention can be produced by various methods. For example, a container (packaging material) may be produced by subjecting a sheet of the multilayer structure or a film material including the multilayer structure (such a material will hereinafter be simply referred to as "film material") to a joining process and thereby forming the sheet of the multilayer structure or the film material into a predetermined container shape. Examples of the method for shaping include thermoforming, injection molding, and extrusion blow molding. Alternatively, a container (packaging material) may be produced by forming the layer (Y) on the base (X) that has been formed in a predetermined container shape beforehand. A container thus produced may be referred to as a "packaging container" herein.

The packaging material according to the present invention is preferably used as a food packaging material. The packaging material according to the present invention can be preferably used not only as a food packaging material but also as a packaging material for packaging any of the following: chemicals such as agrochemicals and pharmaceuticals; medical devices; industrial materials such as machinery components and delicate materials; and garments.

The packaging material including the multilayer structure of the present invention can be used after being formed into any of various shaped products by secondary processing. Such a shaped product may be a vertical form-fill-seal bag, a vacuum packaging bag, a pouch, a laminated tube container, an infusion bag, a paper container, a strip tape, a container lid, an in-mold labeled container, a vacuum insulator, or an electronic device. These shaped products may be formed through heat sealing.

[Vertical Form-Fill-Seal Bag]

The packaging material including the multilayer structure of the present invention may be a vertical form-fill-seal bag. An example is shown in FIG. 1. A vertical form-fill-seal bag 10 of FIG. 1 is formed of a multilayer structure 11 of the present invention that is sealed at three portions, i.e., two edge portions 11a and a body portion 11b. The vertical form-fill-seal bag 10 can be produced by a vertical form-fill-seal machine. Various methods can be employed for bag making by a vertical form-fill-seal machine. In any method, the substance to be contained in the bag is fed through the top opening of the bag into its interior, and the opening is then sealed to produce the vertical form-fill-seal bag. The vertical form-fill-seal bag includes, for example, one film material heat-sealed at three portions, its upper edge, lower edge, and side. The vertical form-fill-seal bag as the packaging container according to the present invention has good gas barrier properties and good water vapor barrier properties and maintains its barrier performance even after retorting. The vertical form-fill-seal bag is therefore capable of preventing quality degradation of the contained substance over a long period of time. In addition, the vertical form-fill-seal bag of the present invention has high retort resistance and suffers from no appearance defect such as delamination after retorting.

[Pouch]

Figure 2:
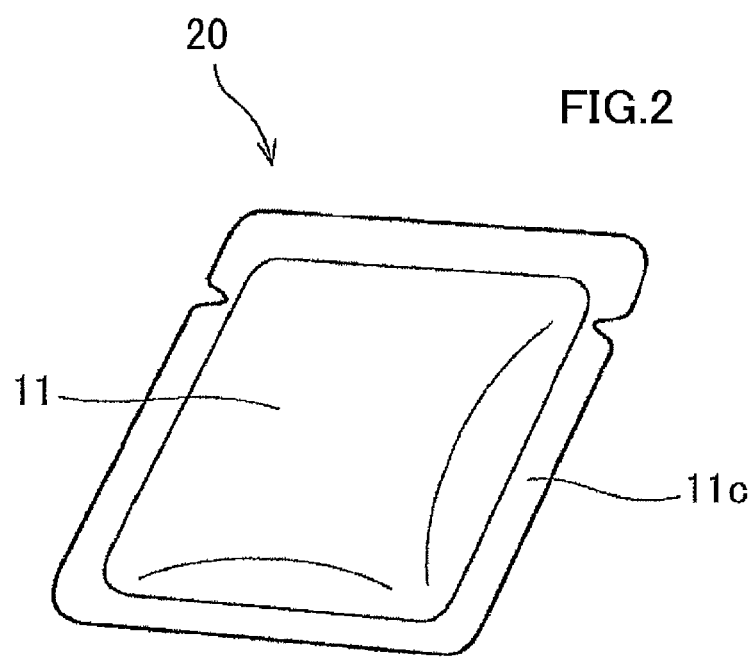
FIG. 2 is a schematic diagram of a flat pouch according to an embodiment of the present invention.

The packaging material including the multilayer structure of the present invention may be a pouch. An example is shown in FIG. 2. A flat pouch 20 of FIG. 2 is formed of two multilayer structures 11 joined together at their edges 11c. The term "pouch" as used herein refers to a container including a film material as a barrier member and mainly intended to contain a food, a daily commodity, or a medical product. Pouches can have various shapes and applications, and examples include a spouted pouch, a zippered pouch, a flat pouch, a stand-up pouch, a horizontal form-fill-seal pouch, and a retort pouch. Such a pouch may be formed by stacking a multilayer structure and at least one additional layer (J) together. The pouch as the packaging container according to the present invention has good gas barrier properties and good water vapor barrier properties and maintains its barrier performance even after retorting. The use of the pouch can therefore prevent the contained substance from changing in quality after transportation or long-term storage. In an example, the pouch can hold good transparency, which allows easy identification of the contained substance and easy check for change in the quality of the contained substance caused by degradation. In addition, the pouch of the present invention has high retort resistance and suffers from no appearance defect such as delamination after retorting.

[Infusion Bag]

Figure 3:
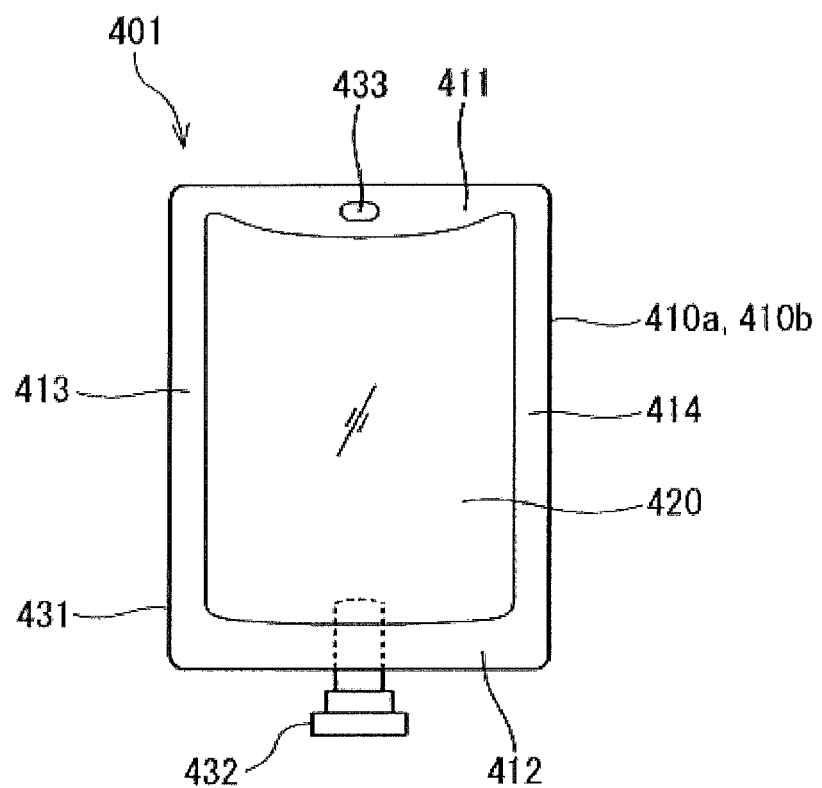
FIG. 3 is a schematic diagram of an exemplary infusion bag according to an embodiment of the present invention.

The packaging material including the multilayer structure of the present invention may be an infusion bag. The infusion bag is a container intended to contain an infusion drug and includes a film material as a separation barrier separating the interior for containing the infusion drug from the outside. An example is shown in FIG. 3. As shown in FIG. 3, an infusion bag 401 includes a bag body 431 for containing a substance and may further include a plug member 432 attached at an edge 412 of the bag body 431. The plug member 432 functions as a passage for letting out an infusion contained in the interior of the bag body 431. The infusion bag may include a hanging hole 433 for hanging the bag, the hole being provided in an edge 411 opposite to the edge 412 at which the plug member 432 is attached. The bag body 431 is formed of two film materials 410a and 410b joined together at the edges 411, 412, 413, and 414. The film materials 410a and 410b function together as a separation barrier 420 separating the interior of the bag from the outside of the bag in a central portion of the bag body 431 which is bounded by the edges 411, 412, 413, and 414. The infusion bag as the packaging container according to the present invention has good gas barrier properties and maintains the gas barrier properties even after thermal treatment such as hot water treatment. The infusion bag is therefore capable of preventing the contained liquid medical product from changing in quality before, during, and after heat sterilization, after transportation, and after storage. In addition, the infusion bag of the present invention suffers from no appearance defect such as delamination even after thermal treatment such as hot water treatment.

[In-Mold Labeled Container]

The packaging material including the multilayer structure of the present invention may be an in-mold labeled container. The in-mold labeled container includes a container body and a multilayer label (multilayer structure) according to the present invention which is provided on the surface of the container body. The container body is formed through injection of a molten resin into a mold. The shape of the container body is not particularly limited, and may be, for example, a cup shape or bottle shape.

An example of the method for producing a container according to the present invention includes: a first step of placing a multilayer label of the present invention in a cavity between a female mold member and a male mold member; and a second step of injecting a molten resin into the cavity to perform molding of a container body and lamination of the multilayer label of the present invention to the container body simultaneously. Each step can be carried out in the same manner as in known methods, except for using the multilayer label of the present invention.

Figure 4:
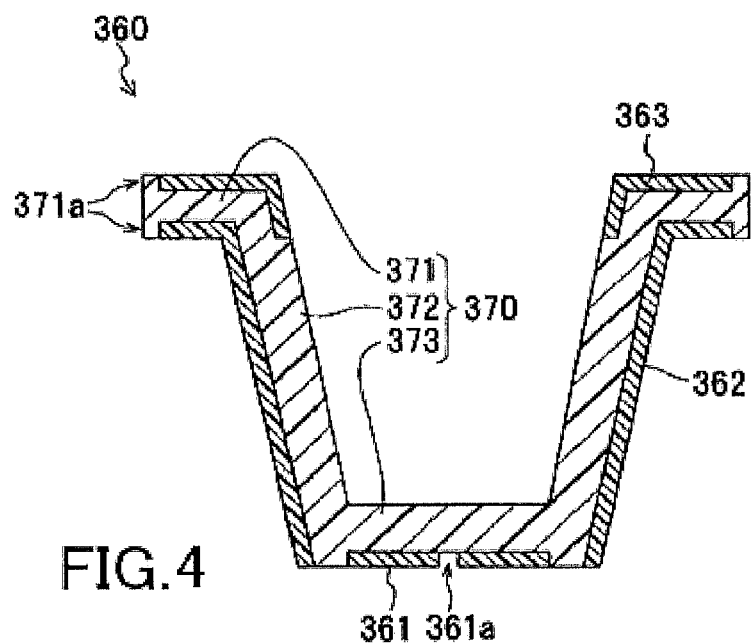
FIG. 4 is a schematic diagram of an exemplary in-mold labeled container according to an embodiment of the present invention.

A cross-sectional view of an example of the container of the present invention is shown in FIG. 4. A container 360 includes a cup-shaped container body 370 and multilayer labels 361 to 363 laminated to surfaces of the container body 370. The multilayer labels 361 to 363 are each the multilayer label of the present invention. The container body 370 includes a flange portion 371, a body portion 372, and a bottom portion 373. The flange portion 371 has at its edges projections 371a extending upwardly and downwardly. The multilayer label 361 is disposed to cover the outer surface of the bottom portion 373. At the center of the multilayer label 361 there is formed a through hole 361a for resin injection in the in-mold labeling. The multilayer label 362 is disposed to cover the outer surface of the body portion 372 and the under surface of the flange portion 371. The multilayer label 363 is disposed to cover a part of the inner surface of the body portion 372 and the top surface of the flange portion 371. The multilayer labels 361 to 363 are fused with the container body 370 and united with the container body 370 by in-mold labeling. As shown in FIG. 4, the edge surfaces of the multilayer label 363 are fused with the container body 370 and are not exposed to the outside.

[Vacuum Insulator]

A product of the present invention that includes the packaging material as described above in at least a part thereof may be a vacuum insulator. The vacuum insulator is a heat insulator including a sheath material and a core material disposed in an interior bounded by the sheath material, and the interior in which the core material is disposed has a reduced pressure. A vacuum insulator thinner and lighter than an insulator made of urethane foam can provide heat insulating properties comparable to the heat insulating properties provided by the urethane foam insulator. The vacuum insulator of the present invention can be used, for example, as or in the following: a heat insulating material for home electric appliances such as refrigerators, hot-water supply systems, and rice cookers; a residential heat insulating material used in walls, ceilings, attics, floors, etc.; a vehicle roof member; an insulating panel for automatic vending machines etc.; and a heat transfer apparatus such as a heat storage apparatus or an apparatus employing a heat pump. When used as the sheath material, the multilayer structure of the present invention preferably includes an ethylene-vinyl alcohol copolymer resin layer and an inorganic deposited layer and may have, for example, a configuration of "polyester layer/layer (YZ)/polyester layer/layer (YZ)/inorganic deposited layer/ethylene-vinyl alcohol copolymer layer/polyolefin layer". The vacuum insulator of the present invention retains good interlayer adhesion and suffers from no appearance defect such as delamination even at high temperature and high humidity.

Figure 6:
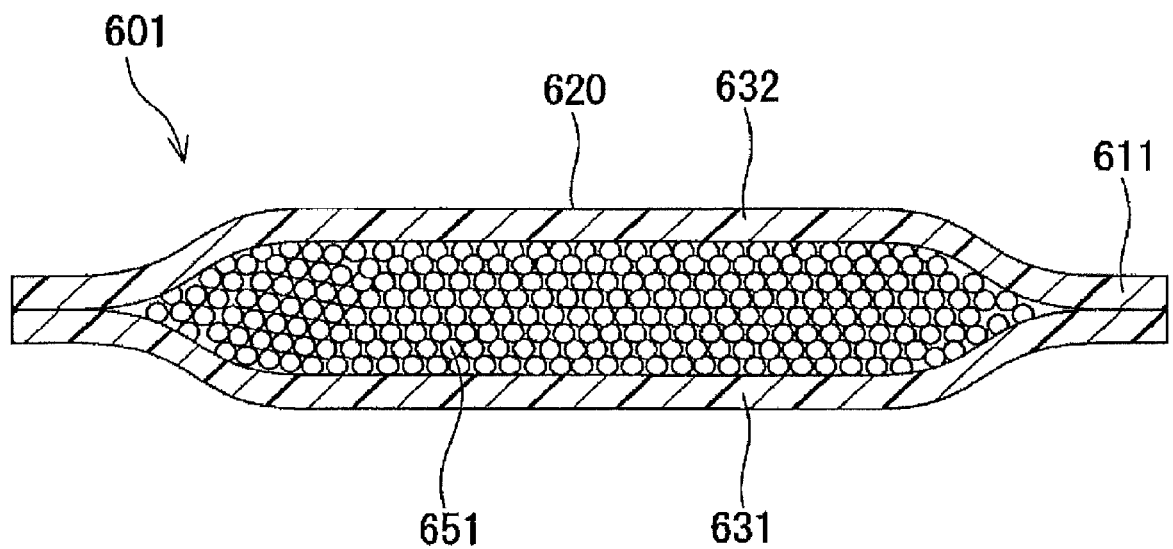
FIG. 6 is a schematic diagram of an exemplary vacuum insulator according to an embodiment of the present invention.

An example of the vacuum insulator of the present invention is shown in FIG. 6. A vacuum insulator 601 of FIG. 6 includes a core material 651 in the form of particles and two multilayer structures 631 and 632 of the present invention that together form a sheath material enclosing the core material 651. The two multilayer structures 631 and 632 are joined together at their edges 611. The interior defined by the two multilayer structures 631 and 632 is filled with the core material 651, and the interior has a reduced pressure. The two multilayer structures 631 and 632 function together as a separation barrier 620 separating the interior containing the core material 651 from the outside and, due to pressure difference between the inside and outside of the vacuum insulator 601, are in close contact with the core material 651. The interior in which the core material 652 is disposed has a reduced pressure.

Figure 7:
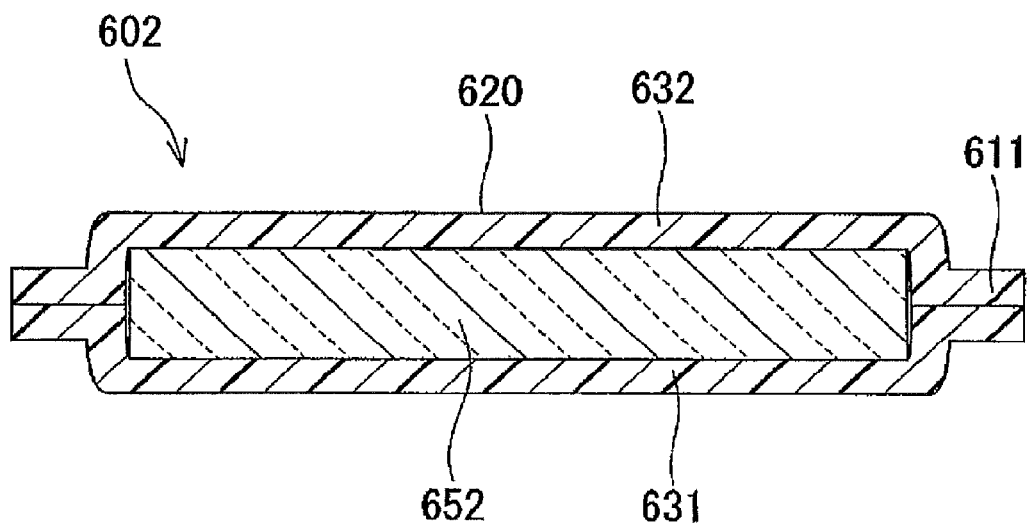
FIG. 7 is a schematic diagram of another exemplary vacuum insulator according to an embodiment of the present invention.

Another example of the vacuum insulator of the present invention is shown in FIG. 7. A vacuum insulator 602 has the same configuration as the vacuum insulator 601, except for including, instead of the core material 651, a core material 652 formed as a single body. The core material 652, which is a shaped product, is typically a foamed resin.

The component and form of the core material are not particularly limited as long as they are adapted for heat insulation. Examples of the core material include a perlite powder, a silica powder, a precipitated silica powder, diatomite, calcium silicate, glass wool, rockwool, artificial (synthetic) wool, and foamed resins (such as styrene foam and urethane foam). A hollow container or honeycomb structure formed in a predetermined shape can also be used as the core material.

[Electronic Device]

Figure 8:
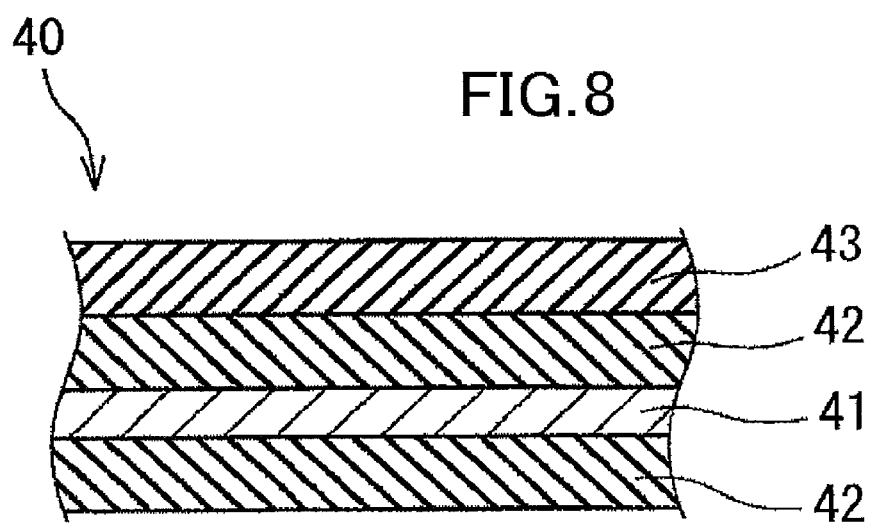
FIG. 8 is a partial cross-sectional view of an electronic device according to an embodiment of the present invention.

The packaging material including the multilayer structure of the present invention can be used also in an electronic device. A partial cross-sectional view of an example of the electronic device of the present invention is shown in FIG. 8. An electronic device 40 of FIG. 8 includes an electronic device body 41, a sealing material 42 for sealing the electronic device body 41, and a protective sheet (multilayer structure) 43 for protecting the surface of the electronic device body 41. The sealing material 42 covers the entire surface of the electronic device body 41. The protective sheet 43 is disposed over one side of the electronic device body 41, with the sealing material 42 interposed therebetween. On the side opposite to that where the protective sheet 43 is disposed there may be disposed another protective sheet. In this case, the protective sheet disposed on the opposite side may be the same as or different from the protective sheet 43. The protective sheet 43 may be disposed over the electronic device body 41, with another member such as the sealing material 42 interposed therebetween, or may be disposed directly on the surface of the electronic device body 41.

Examples of the electronic device body 41 include, but are not limited to: photoelectric conversion devices such as solar cells; information display devices such as organic EL displays, liquid crystal displays, and electronic paper; and lighting devices such as organic EL elements. The sealing material 42 is an optional member that can be added as appropriate depending on, for example, the type and use of the electronic device body 41. Examples of the sealing material 42 include ethylene-vinyl acetate copolymer and polyvinyl butyral.

A preferred example of the electronic device body 41 is a solar cell. Examples of the solar cell include a silicon solar cell, a compound semiconductor solar cell, and an organic thin-film solar cell. Examples of the silicon solar cell include a monocrystalline silicon solar cell, a polycrystalline silicon solar cell, and an amorphous silicon solar cell. Examples of the compound semiconductor solar cell include a III-V compound semiconductor solar cell, a II-VI compound semiconductor solar cell, and a I-III-VI compound semiconductor solar cell. The solar cell may or may not be an integrated solar cell including a plurality of unit cells connected in series.

The multilayer structure of the present invention and the packaging material including the multilayer structure are suitable for use as or in the following; a display member such as a substrate film for LCDs, a substrate film for organic ELs, a substrate film for electronic paper, a sealing film for electronic devices, or a film for PDPs; a film for IC tags; a solar cell module; and a solar cell member such as a back sheet for solar cells and a protective film for solar cells. When used as a member of a display, the multilayer structure functions, for example, as a low-reflection film.

Depending on its type, the electronic device body 41 can be produced by a so-called roll-to-roll process. In the roll-to-roll process, a flexible substrate (e.g., a stainless steel substrate or a resin substrate) wound around a feed roll is delivered from the feed roll, then an element is formed on this substrate to produce the electronic device body 41, and finally the electronic device body 41 is wound on a take-up roll. In this case, it is advantageous that the protective sheet 43 be prepared beforehand in the form of a flexible long sheet, more particularly in the form of a wound roll of the long sheet. In an example, the protective sheet 43 delivered from a feed roll is stacked onto the electronic device body 41 that has yet to be wound on the take-up roll and is wound up together with the electronic device body 41. In another example, the electronic device body 41 that has been wound on the take-up roll once may be fed from the roll again and stacked onto the protective sheet 43. In a preferred example of the present invention, the electronic device per se has flexibility.

The protective sheet 43 includes the multilayer structure of the present invention. The protective sheet 43 may consist only of the multilayer structure. Alternatively, the protective sheet 43 may include the multilayer structure and other member(s) (e.g., the additional layer (J)) stacked on the multilayer structure. The thickness and material of the protective sheet 43 are not particularly limited, as long as the protective sheet 43 is a sheet of layered product suitable for protection of a surface of an electronic device and includes the multilayer structure described above.

The protective sheet may include, for example, a surface protection layer disposed on one or both of the surfaces of the multilayer structure. It is preferable for the surface protection layer to be a layer made of a scratch-resistant resin. A surface protection layer for a device such as a solar cell which may be used outdoors is preferably made of a resin having high weather resistance (e.g., light resistance). For protecting a surface required to permit transmission of light, a surface protection layer having high light transmissivity is preferred. Examples of the material of the surface protection layer (surface protection film) include poly(meth) acrylic acid ester, polycarbonate, polyethylene terephthalate, polyethylene-2,6-naphthalate, polyvinyl fluoride (PVF), polyvinylidene fluoride (PVDF), polytetrafluoroethylene (PTFE), polychlorotrifluoroethylene (PCTFE), ethylene-tetrafluoroethylene copolymer (ETFE), ethylene-chlorotrifluoroethylene copolymer (ECTFE), tetrafluoroethylene-perfluoroalkyl vinyl ether copolymer (PFA), and tetrafluoroethylene-hexafluoropropylene copolymer (FEP). In an example, the protective sheet includes a poly(meth) acrylic acid ester layer disposed on one surface of the multilayer structure.

An additive (e.g., an ultraviolet absorber) may be added to the surface protection layer to increase the durability or weather resistance of the surface protection layer. A preferred example of the surface protection layer having high weather resistance is an acrylic resin layer to which an ultraviolet absorber has been added. Examples of the ultraviolet absorber include, but are not limited to, ultraviolet absorbers based on benzotriazole, benzophenone, salicylate, cyanoacrylate, nickel, or triazine. In addition, another additive such as a stabilizer, light stabilizer, or antioxidant may be used in combination.

EXAMPLES

Hereinafter, the present invention will be described in more detail by way of examples. The present invention is not limited by these examples in any respect, and many modifications can be made by any ordinarily skilled person in the art within the technical concept of the present invention. Analysis and evaluation in Examples and Comparative Examples given below were performed as will now be described.

(1) Measurement of Infrared Absorption Spectrum

The measurement was performed by attenuated total reflection spectroscopy using a Fourier transform infrared spectrophotometer. The measurement conditions were as follows.

Apparatus: Spectrum One, manufactured by PerkinElmer, Inc.

Measurement mode: Attenuated total reflection spectroscopy

Measurement range: 800 to 1,400 $cm^{-1}$ (2) Measurement of Respective Thicknesses of Layers A multilayer structure was cut using a focused ion beam (FIB) to prepare a section for cross-sectional observation.

The prepared section was secured to a sample stage with a carbon tape and subjected to platinum ion sputtering at an accelerating voltage of 30 kV for 30 seconds. The cross-section of the multilayer structure was observed using a field-emission transmission electron microscope to determine the respective thicknesses of the layers. The measurement conditions were as follows.

Apparatus: JEM-2100F, manufactured by JEOL Ltd.
Accelerating voltage: 200 kV
Magnification: ×250,000

(3) Measurement of Oxygen Transmission Rate

A sample was set to an oxygen transmission rate measurement apparatus in such a manner that the layer as the base faced the carrier gas side, and the oxygen transmission rate was measured by an equal pressure method. The measurement conditions were as follows.

Apparatus: MOCON OX-TRAN 2/20, manufactured by ModernControls, Inc.
Temperature: 20° C.
Humidity on oxygen feed side: 85% RH
Humidity on carrier gas side: 85% RH
Oxygen pressure: 1.0 atm
Carrier gas pressure: 1.0 atm (4) Measurement of Oxygen Transmission Rate after Stretching First, a multilayer structure was cut to prepare a measurement sample having a size of 15 cm×10 cm. This sample was left in an atmosphere at 23° C. and 50% RH for 24 hours, after which, in the same atmosphere, the sample was longitudinally stretched by 3% and kept stretched for 10 seconds. The oxygen transmission rate of the sample subjected to stretching was measured by the method described in (3) above.

(5) Measurement of Moisture Permeability

A sample was set to a water vapor transmission rate measurement apparatus in such a manner that the layer as the base faced the carrier gas side, and the moisture permeability (water vapor transmission rate) was measured by an equal pressure method. The measurement conditions were as follows.

Apparatus: MOCON PERMATRAN W3/33, manufactured by ModernControls, Inc.
Temperature: 40° C.
Humidity on water vapor feed side: 90% RH
Humidity on carrier gas side: 0% RH (6) Evaluation of Adhesion The adhesion between the layer (Z) and a layer (adhesive layer in the present examples) contiguous to the layer (Z) was evaluated by measurement of a T-peel strength (adhesive strength per 15 mm width). The measurement was performed five times, and an average of the measured values was employed as an index. The measurement conditions were as follows.

Apparatus: Autograph AGS-H, manufactured by Shimadzu Corporation
Peel rate: 250 mm/min
Temperature: 23° C.
Humidity: 50% RH To evaluate the adhesion after damp heat test, a test (damp heat test) was conducted in which the sample was stored at atmospheric pressure, 85° C., and 85% RH for 1,000 hours using a thermo-hygrostat. After the test, the adhesion between the layer (Z) and a layer (adhesive layer in the present examples) contiguous to the layer (Z) was evaluated by measurement of a T-peel strength (adhesive strength per 15 mm width). The measurement was performed five times, and an average of the measured values was employed as an index. The measurement conditions were as shown above.

(7) Evaluation of Appearance of Protective Sheet Subjected to Damp Heat Test

The appearance of protective sheets subjected to the damp heat test was visually evaluated according to the following criteria.

A: The multilayer structure was free of delamination between the layers and had good appearance.
B: The multilayer structure was observed to have partial delamination between the layers.

Production Example of Coating Liquid (S-1)

Distilled water in an amount of 230 parts by mass was heated to 70° C. under stirring. Triisopropoxyaluminum in an amount of 88 parts by mass was added dropwise to the distilled water over 1 hour, the liquid temperature was gradually increased to 95° C., and isopropanol generated was distilled off. In this manner, hydrolytic condensation was performed. To the resulting liquid was added 4.0 parts by mass of a 60 mass % aqueous nitric acid solution, and this was followed by stirring at 95° C. for 3 hours to deflocculate agglomerates of particles of the hydrolytic condensate. After that, the liquid was concentrated so that the concentration of solids calculated as aluminum oxide was adjusted to 10 mass %. To 22.50 parts by mass of the solution thus obtained were added 54.29 parts by mass of distilled water and 18.80 parts by mass of methanol. This was followed by stirring to obtain a homogeneous dispersion. Subsequently, 4.41 parts by mass of an 85 mass % aqueous phosphoric acid solution was added dropwise to the dispersion under stirring, with the liquid temperature held at 15° C. The stirring was continued at 15° C. until a viscosity of 1,500 mPa·s was reached. The intended coating liquid (S-1) was thus obtained. In the coating liquid (S-1), the molar ratio between aluminum atoms and phosphorus atoms, as expressed by [aluminum atoms]:[phosphorus atoms], was 1.15:1.00.

Synthesis Example of Organic Phosphorus Compound (BO-1)

Under a nitrogen atmosphere, 10 g of vinylphosphonic acid and 0.025 g of 2,2'-azobis(2-amidinopropane) dihydrochloride were dissolved in 5 g of water, and the resulting solution was stirred at 80° C. for 3 hours. After being cooled, the polymer solution was diluted by addition of 15 g of water and then filtered using "Spectra/Por" (registered trademark), a cellulose membrane manufactured by Spectrum Laboratories, Inc. Water was removed from the filtrate by distillation, followed by vacuum drying at 50° C. for 24 hours, thus giving a polymer (BO-1). The polymer (BO-1) was poly (vinylphosphonic acid). As a result of GPC analysis, the number-average molecular weight of the polymer was determined to be 10,000 on a polyethylene glycol-equivalent basis.

Production Example of Coating Liquid (T-1)

There was prepared a mixture containing 77 mass % of the organic phosphorus compound (BO-1) obtained in the above synthesis example and 23 mass % of polyethylene glycol having a weight-average molecular weight of 20,000 ("PEG-20000" manufactured by Sanyo Chemical Industries, Ltd.) as the polymer (F). This mixture was dissolved in a mixed solvent of water and methanol (at a weight ratio,

[water]:[methanol], of 7:3) to obtain a coating liquid (T-1) having a solids concentration of 1 mass %.

<Production examples of coating liquids (T-2) to (T-8)>

Coating liquids (T-2) to (T-8) were prepared in the same manner as the coating liquid (T-1), except for changing the type of the polymer (F) and the mass ratio between the organic phosphorus compound (BO) and polymer (F) as shown in Table 1. In the preparation of the coating liquid (T-2), polyethylene oxide having a weight-average molecular weight of 60,000 ("ALKOX (registered trademark) L-6" manufactured by Meisei Chemical Works, Ltd.) was used as the polymer (F). In the preparation of the coating liquid (T-7), α-cyclodextrin (manufactured by Wako Pure Chemical Industries, Ltd. and having a purity corresponding to Wako 1st grade) was used instead of the polymer (F). In the preparation of the coating liquid (T-8), starch (manufactured by Wako Pure Chemical Industries, Ltd., being soluble, and having a purity corresponding to Wako 1st grade) was used instead of the polymer (F).

The details of films used in Examples and Comparative Examples were as follows.

1) PET 12: Oriented polyethylene terephthalate film, manufactured by Toray Industries, Inc. under the trade name "Lumirror (registered trademark) P60" and having a thickness of 12 μm 2) PET 50: Polyethylene terephthalate film with improved adhesion to ethylene-vinyl acetate copolymer, manufactured by TOYOBO CO., LTD. under the trade name "SHINEBEAM (registered trademark) Q1A15" and having a thickness of 50 μm 3) ONY: Oriented nylon film, manufactured by UNITIKA LTD. under the trade name "EMBLEM (registered trademark) ONBC" and having a thickness of 15 μm 4) CPP 60: Non-oriented polypropylene film, manufactured by Mitsui Chemicals Tohcello, Inc. under the trade name "RXC-21" and having a thickness of 60 μm 5) CPP 70: Non-oriented polypropylene film, manufactured by Mitsui Chemicals Tohcello, Inc. under the trade name "RXC-21" and having a thickness of 70 μm 6) CPP 100: Non-oriented polypropylene film, manufactured by Mitsui Chemicals Tohcello, Inc. under the trade name "RXC-21" and having a thickness of 100 μm 7) VM-EVOH: Biaxially-oriented ethylene-vinyl alcohol copolymer film with a deposited layer of aluminum, manufactured by KURARAY CO., LTD. under the trade name "VM-XL" and having a thickness of 12 μm Example 1

Example 1-1

First, a PET 12 (which may hereinafter be abbreviated as "X-1") was prepared as the base (X). The coating liquid (S-1) was applied onto the base using a bar coater so that the dry thickness would be 0.3 μm. The film of the applied liquid was dried at 110° C. for 5 minutes and then heat-treated at 160° C. for 1 minute to form a precursor layer of a layer (Y-1-1) on the base. Next, the coating liquid (T-1) was applied using a bar coater so that the ratio $W_{BO}/W_{BI}$ between the mass $W_{BI}$ of the inorganic phosphorus compound (BI) and the mass $W_{BO}$ of the organic phosphorus compound (BO) would be 0.21, and the applied liquid was dried at 110° C. for 3 minutes. This was followed by heat treatment at 220° C. for 1 minute. In this way, a multilayer structure (1-1-1) having a configuration of "base (X-1)/layer (Y-1-1)/ layer (Z-1-1)" was obtained. For the multilayer structure (1-1-1) obtained, the respective thicknesses of the layers, the oxygen transmission rate, and the moisture permeability were measured by the methods previously described. The thickness of the layer (Y-1-1) was 0.3 μm, and the thickness of the layer (Z-1-1) was 0.09 μm. The moisture permeability was 0.2 g/(m²·day). For the multilayer structure (1-1-1) obtained, the oxygen transmission rate after stretching was also measured by the method previously described. The results are shown in Table 1.

As a result of measurement of the infrared absorption spectrum of the multilayer structure (1-1-1), the maximum absorption wavenumber in the region from 800 to 1,400 cm$^{-1}$ was determined to be 1,108 cm$^{-1}$, and the width at half maximum of the maximum absorption band was determined to be 37 cm$^{-1}$.

An adhesive layer was formed on the multilayer structure (1-1-1) obtained as above, and an ONY was then laminated on the adhesive layer to obtain a layered product. Next, an adhesive layer was formed on the ONY of the layered product, and a CPP 70 was then laminated on the adhesive layer. The resulting laminate was allowed to stand at 40° C. for 5 days for aging. In this way, a multilayer structure (1-1-2) having a configuration of "base (X-1)/layer (Y-1-1)/ layer (Z-1-1)/adhesive layer/ONY layer/adhesive layer/CPP layer" was obtained. The two adhesive layers were each formed by applying a two-component adhesive using a bar coater so that the dry thickness would be 3 μm and then by drying the adhesive. The two-component adhesive used was an adhesive composed of "A-525S" (product name) of "TAKELAC" (registered trademark) manufactured by Mitsui Chemicals, Inc. and "A-50" (product name) of "TAKENATE" (registered trademark) manufactured by Mitsui Chemicals, Inc. For the multilayer structure (1-1-2) obtained, the oxygen transmission rate and moisture permeability were measured by the methods previously described.

The multilayer structure (1-1-2) was heat-sealed to form a pouch, and the pouch was filled with 100 g of water. The pouch thus obtained was then subjected to retorting (hot water retaining method) under the following conditions.

Retorting apparatus: Flavor Ace RSC-60, manufactured by HISAKA WORKS, LTD.
Temperature: 130° C.
Time: 30 minutes
Pressure: 0.21 MPaG Immediately after the hot water treatment, a measurement sample was cut out from the pouch, and the oxygen transmission rate and moisture permeability of the sample were measured by the methods previously described. In addition, the pouch subjected to retorting was dried at 23° C. and 50% RH for 24 hours, after which the T-peel strength of the multilayer structure (1-1-2) was measured. The results are shown in Table 2. The multilayer structure (1-1-2) showed no appearance defect such as delamination.

Examples 1-2 to 1-4

Multilayer structures (1-2-1) to (1-4-1) were produced in the same manner as the multilayer structure (1-1-1), except for changing the mass ratio between the organic phosphorus compound (BO) and the inorganic phosphorus compound (BI) according to Table 1. Multilayer structures (1-2-2) to (1-4-2) were produced in the same manner as the multilayer structure (1-1-2) of Example 1-1, except for substituting the multilayer structure (1-1-1) with the multilayer structures (1-2-1) to (1-4-1). The multilayer structures obtained were evaluated. The results are shown in Table 1 and Table 2. The multilayer structures (1-2-2) to (1-4-2) showed no appearance defect such as delamination.

Examples 1-5 to 1-8 and Comparative Examples 1-1 to 1-3

Multilayer structures (1-5-1) to (1-8-1) and (C1-1-1) to (C1-3-1) were produced in the same manner as the multilayer structure (1-1-1) of Example 1-1, except for using the coating liquids (T-2) to (T-8) instead of the coating liquid (T-1). Multilayer structures (1-5-2) to (1-8-2) and (C1-1-2) to (C1-3-2) were produced in the same manner as the multilayer structure (1-1-2) of Example 1-1, except for substituting the multilayer structure (1-1-1) with the multilayer structures (1-5-1) to (1-8-1) and (C1-1-1) to (C1-3-1). The multilayer structures obtained were evaluated. The results are shown in Table 1 and Table 2. The multilayer structures (1-5-2) to (1-8-2) showed no appearance defect such as delamination. The multilayer structures (C1-1-2) to (C1-3-2) showed delamination.

TABLE 1

| | Multilayer structure No. | Base (X) | Layer (Y) Coating liquid (S) No. | Thickness (μm) | Coating liquid (T) No. | Layer (Z) Organic phosphorus compound (BO) Name | Polymer (F) Type |
|---|---|---|---|---|---|---|---|
| Example 1-1 | 1-1-1 | PET | S-1 | 0.3 | T-1 | PVPA | PEG (Mw: 20000) |
| Example 1-2 | 1-2-1 | PET | S-1 | 0.3 | T-1 | PVPA | PEG (Mw: 20000) |
| Example 1-3 | 1-3-1 | PET | S-1 | 0.3 | T-1 | PVPA | PEG (Mw: 20000) |
| Example 1-4 | 1-4-1 | PET | S-1 | 0.3 | T-1 | PVPA | PEG (Mw: 20000) |
| Example 1-5 | 1-5-1 | PET | S-1 | 0.3 | T-2 | PVPA | PEG (Mw: 60000) |
| Example 1-6 | 1-6-1 | PET | S-1 | 0.3 | T-3 | PVPA | PEG (Mw: 20000) |
| Example 1-7 | 1-7-1 | PET | S-1 | 0.3 | T-4 | PVPA | PEG (Mw: 20000) |
| Example 1-8 | 1-8-1 | PET | S-1 | 0.3 | T-5 | PVPA | PEG (Mw: 20000) |
| Comparative Example 1-1 | C1-1-1 | PET | S-1 | 0.3 | T-6 | PVPA | — |
| Comparative Example 1-2 | C1-2-1 | PET | S-1 | 0.3 | T-7 | PVPA | Cyclodextrin |
| Comparative Example 1-3 | C1-3-1 | PET | S-1 | 0.3 | T-8 | PVPA | Starch |

| | Layer (Z) Mass ratio (BO):(F) | Layer (Z) Mass ratio $W_{BO}/W_{BI}$ | IR Maximum absorption wavenumber (cm$^{-1}$) | IR Width at half maximum (cm$^{-1}$) | Oxygen transmission rate Before stretching (mL/(m$^2$·day·atm)) | Oxygen transmission rate After stretching (mL/(m$^2$·day·atm)) |
|---|---|---|---|---|---|---|
| Example 1-1 | 77:23 | 0.21 | 1,108 | 37 | 0.20 | 2.84 |
| Example 1-2 | 77:23 | 0.32 | 1,108 | 37 | 0.20 | 1.78 |
| Example 1-3 | 77:23 | 0.10 | 1,108 | 37 | 0.21 | 4.88 |
| Example 1-4 | 77:23 | 0.05 | 1,108 | 37 | 0.20 | 18.25 |
| Example 1-5 | 77:23 | 0.21 | 1,108 | 37 | 0.20 | 3.21 |
| Example 1-6 | 67:33 | 0.21 | 1,108 | 37 | 0.19 | 4.23 |
| Example 1-7 | 40:60 | 0.21 | 1,108 | 37 | 0.21 | 8.79 |
| Example 1-8 | 91:9 | 0.21 | 1,108 | 37 | 0.20 | 1.19 |
| Comparative Example 1-1 | 100:0 | 0.21 | 1,108 | 37 | 0.20 | 0.67 |
| Comparative Example 1-2 | 77:23 | 0.21 | 1,108 | 37 | 0.20 | 2.10 |
| Comparative Example 1-3 | 77:23 | 0.21 | 1,108 | 37 | 0.20 | 1.96 |

[Abbreviations in the table]
PVPA: Poly(vinylphosphonic acid)
PEG: Polyethylene glycol
PEO: Polyethylene oxide

TABLE 2

|  | Multilayer structure No. | Oxygen transmission rate | | Moisture permeability | | Peel strength |
|---|---|---|---|---|---|---|
|  |  | Before retorting (mL/(m² · day · atm)) | After retorting | Before retorting (g/(m² · day)) | After retorting | After retorting (g/15 mm) |
| Example 1-1 | 1-1-2 | 0.20 | 0.20 | 0.2 | 0.2 | 570 |
| Example 1-2 | 1-2-2 | 0.22 | 0.28 | 0.2 | 0.2 | 520 |
| Example 1-3 | 1-3-2 | 0.22 | 0.22 | 0.2 | 0.2 | 570 |
| Example 1-4 | 1-4-2 | 0.21 | 0.22 | 0.2 | 0.2 | 580 |
| Example 1-5 | 1-5-2 | 0.19 | 0.24 | 0.2 | 0.2 | 560 |
| Example 1-6 | 1-6-2 | 0.20 | 0.19 | 0.2 | 0.2 | 590 |
| Example 1-7 | 1-7-2 | 0.20 | 0.26 | 0.2 | 0.3 | 540 |
| Example 1-8 | 1-8-2 | 0.21 | 0.23 | 0.2 | 0.2 | 520 |
| Comparative Example 1-1 | C1-1-2 | 0.21 | 0.24 | 0.2 | 0.3 | 150 |
| Comparative Example 1-2 | C1-2-2 | 0.20 | 0.23 | 0.2 | 0.2 | 150 |
| Comparative Example 1-3 | C1-3-2 | 0.20 | 0.21 | 0.2 | 0.2 | 140 |

[Example 2] Vertical Form-Fill-Seal Bag

Example 2-1

The multilayer structure (1-1-2) as produced in Example 1-1 was cut into a 400-mm-wide piece, which was fed to a vertical form-fill-seal packaging machine (manufactured by ORIHIRO Co., Ltd.) in such a manner that the heat sealing would be performed with CPP layers being in contact with each other. Using the vertical form-fill-seal packaging machine, a vertical form-fill-seal bag (2-1-3) of the fin seal type (width: 160 mm, length: 470 mm) as shown in FIG. 1 was produced. A measurement sample was cut out from the vertical form-fill-seal bag (2-1-3). The oxygen transmission rate and moisture permeability of the sample subjected to neither retorting nor stretching were measured. The results are shown in Table 3. Another vertical form-fill-seal bag (2-1-3) was heat-sealed to form a pouch, and the pouch was filled with 300 mL of water. The pouch obtained was then subjected to retorting (hot water retaining method) under the same conditions as in Example 1-1.

Immediately after the hot water treatment, a measurement sample was cut out from the pouch, and the oxygen transmission rate, moisture permeability, and T-peel strength of the sample were measured by the methods previously described. The results are shown in Table 3. No appearance defect such as delamination was observed.

Examples 2-2 to 2-8 and Comparative Examples 2-1 to 2-3

Vertical form-fill-seal bags (2-2-3) to (2-8-3) and (C2-1-3) to (C2-3-3) were produced in the same manner as the vertical form-fill-seal bag (2-1-3) of Example 2-1, except for using, instead of the multilayer structure (1-1-2), the multilayer structures (1-2-2) to (1-8-2) and (C1-1-2) to (C1-3-2) as produced in Examples 1-2 to 1-8 and Comparative Examples 1-1 to 1-3. For the vertical form-fill-seal bags obtained, the various properties were measured in the same manner as in Example 2-1. The results are shown in Table 3. The vertical form-fill-seal bags (2-2-3) to (2-8-3) showed no appearance defect such as delamination. The vertical form-fill-seal bags (C2-1-3) to (C2-3-3) showed delamination.

TABLE 3

|  | Vertical form-fill-seal bag No. | Multilayer structure No. | Oxygen transmission rate | | Moisture permeability | | Peel strength |
|---|---|---|---|---|---|---|---|
|  |  |  | Before retorting (mL/(m² · day · atm)) | After retorting | Before retorting (g/(m² · day)) | After retorting | After retorting (g/15 mm) |
| Example 2-1 | 2-1-3 | 1-1-2 | 0.20 | 0.20 | 0.2 | 0.2 | 560 |
| Example 2-2 | 2-2-3 | 1-2-2 | 0.22 | 0.24 | 0.2 | 0.2 | 520 |
| Example 2-3 | 2-3-3 | 1-3-2 | 0.21 | 0.21 | 0.2 | 0.2 | 560 |
| Example 2-4 | 2-4-3 | 1-4-2 | 0.21 | 0.21 | 0.2 | 0.2 | 580 |
| Example 2-5 | 2-5-3 | 1-5-2 | 0.20 | 0.20 | 0.2 | 0.2 | 550 |
| Example 2-6 | 2-6-3 | 1-6-2 | 0.19 | 0.19 | 0.2 | 0.2 | 570 |
| Example 2-7 | 2-7-3 | 1-7-2 | 0.20 | 0.22 | 0.2 | 0.3 | 580 |
| Example 2-8 | 2-8-3 | 1-8-2 | 0.20 | 0.23 | 0.2 | 0.2 | 510 |
| Comparative Example 2-1 | C2-1-3 | C1-1-2 | 0.21 | 0.22 | 0.2 | 0.3 | 150 |
| Comparative Example 2-2 | C2-2-3 | C1-2-2 | 0.20 | 0.23 | 0.2 | 0.2 | 140 |
| Comparative Example 2-3 | C2-3-3 | C1-3-2 | 0.20 | 0.21 | 0.2 | 0.2 | 150 |

[Example 3] Flat Pouch

Example 3-1

The multilayer structure (1-1-2) as produced in Example 1-1 was cut into two pieces having a size of 120 mm×120 mm, and the two pieces of the multilayer structure were stacked together in such a manner that the CPP layers were located interiorly. The resulting rectangular stack was heat-sealed at its three outer edges with a seal width of 5 mm to form a flat pouch (3-1-3). A measurement sample was cut out from the flat pouch (3-1-3), and the oxygen transmission rate and moisture permeability of the sample subjected to neither retorting nor stretching were measured. The results are shown in Table 4. Another flat pouch (3-1-3) was filled with 100 mL of water. The flat pouch obtained was then subjected to retorting (hot water retaining method) under the same conditions as in Example 1-1. Immediately after the hot water treatment, a measurement sample was cut out from the flat pouch, and the oxygen transmission rate, moisture permeability, and T-peel strength of the sample were measured by the methods previously described. The results are shown in Table 4. No appearance defect such as delamination was observed.

Examples 3-2 to 3-8 and Comparative Examples 3-1 to 3-3

Flat pouches (3-2-3) to (3-8-3) and (C3-1-3) to (C3-3-3) were produced in the same manner as the flat pouch (3-1-3) of Example 3-1, except for using, instead of the multilayer structure (1-1-2), the multilayer structures (1-2-2) to (1-8-2) and (C1-1-2) to (C1-3-2) as produced in Examples 1-2 to 1-8 and Comparative Examples 1-1 to 1-3. For the flat pouches obtained, the various properties were measured in the same manner as in Example 3-1. The results are shown in Table 4. The flat pouches (3-2-3) to (3-8-3) showed no appearance defect such as delamination. The flat pouches (C3-1-3) to (C3-3-3) showed delamination.

[Example 4] Infusion Bag

Example 4-1

Two 120 mm×100 mm pieces of multilayer structure were cut out from the multilayer structure (1-1-2) as produced in Example 1-1. The two cut-out pieces of multilayer structure were then stacked together in such a manner that the CPP layers were located interiorly. The periphery of the resulting stack was heat-sealed, and a spout (plug member) made of polypropylene was attached by heat sealing. In this way, an infusion bag (4-1-3) having the same configuration as that shown in FIG. 3 was produced. A measurement sample was cut out from the infusion bag (4-1-3), and the oxygen transmission rate and moisture permeability of the sample subjected to neither retorting nor stretching were measured. The results are shown in Table 5. Another infusion bag (4-1-3) was filled with 100 mL of water, and subjected to retorting (hot water retaining method) under the same conditions as in Example 1-1. Immediately after the hot water treatment, a measurement sample was cut out from the infusion bag, and the oxygen transmission rate, moisture permeability, and T-peel strength of the sample were measured by the methods previously described. The results are shown in Table 5. No appearance defect such as delamination was observed.

Examples 4-2 to 4-8 and Comparative Examples 4-1 to 4-3

Infusion bags (4-2-3) to (4-8-3) and (C4-1-3) to (C4-3-3) were produced in the same manner as the infusion bag (4-1-3) of Example 4-1, except for using, instead of the multilayer structure (1-1-2), the multilayer structures (1-2-2) to (1-8-2) and (C1-1-2) to (C1-3-2) as produced in Examples 1-2 to 1-8 and Comparative Examples 1-1 to 1-3. For the infusion bags obtained, the various properties were measured in the same manner as in Example 4-1. The results are shown in Table 5. The infusion bags (4-2-3) to (4-8-3) showed no appearance defect such as delamination. The infusion bags (C4-1-3) to (C4-3-3) showed delamination.

TABLE 4

| | Flat pouch No. | Multilayer structure No. | Oxygen transmission rate | | Moisture permeability | | Peel strength |
| --- | --- | --- | --- | --- | --- | --- | --- |
| | | | Before retorting (mL/($m^2$ · day · atm)) | After retorting (mL/($m^2$ · day · atm)) | Before retorting (g/($m^2$ · day)) | After retorting (g/($m^2$ · day)) | After retorting (g/15 mm) |
| Example 3-1 | 3-1-3 | 1-1-2 | 0.20 | 0.20 | 0.2 | 0.2 | 550 |
| Example 3-2 | 3-2-3 | 1-2-2 | 0.21 | 0.24 | 0.2 | 0.2 | 530 |
| Example 3-3 | 3-3-3 | 1-3-2 | 0.20 | 0.22 | 0.2 | 0.2 | 580 |
| Example 3-4 | 3-4-3 | 1-4-2 | 0.20 | 0.21 | 0.2 | 0.2 | 590 |
| Example 3-5 | 3-5-3 | 1-5-2 | 0.19 | 0.21 | 0.2 | 0.2 | 550 |
| Example 3-6 | 3-6-3 | 1-6-2 | 0.19 | 0.20 | 0.2 | 0.2 | 570 |
| Example 3-7 | 3-7-3 | 1-7-2 | 0.20 | 0.21 | 0.2 | 0.2 | 580 |
| Example 3-8 | 3-8-3 | 1-8-2 | 0.21 | 0.22 | 0.2 | 0.2 | 520 |
| Comparative Example 3-1 | C3-1-3 | C1-1-2 | 0.21 | 0.22 | 0.2 | 0.2 | 130 |
| Comparative Example 3-2 | C3-2-3 | C1-2-2 | 0.20 | 0.21 | 0.2 | 0.2 | 140 |
| Comparative Example 3-3 | C3-3-3 | C1-3-2 | 0.21 | 0.21 | 0.2 | 0.2 | 140 |

TABLE 5

| | Infusion bag No. | Multilayer structure No. | Oxygen transmission rate | | Moisture permeability | | Peel strength |
| --- | --- | --- | --- | --- | --- | --- | --- |
| | | | Before retorting (mL/(m² · day · atm)) | After retorting | Before retorting (g/(m² · day)) | After retorting | After retorting (g/15 mm) |
| Example 4-1 | 4-1-3 | 1-1-2 | 0.20 | 0.21 | 0.2 | 0.2 | 550 |
| Example 4-2 | 4-2-3 | 1-2-2 | 0.21 | 0.23 | 0.2 | 0.3 | 520 |
| Example 4-3 | 4-3-3 | 1-3-2 | 0.21 | 0.20 | 0.2 | 0.3 | 570 |
| Example 4-4 | 4-4-3 | 1-4-2 | 0.21 | 0.21 | 0.2 | 0.2 | 580 |
| Example 4-5 | 4-5-3 | 1-5-2 | 0.19 | 0.20 | 0.2 | 0.2 | 540 |
| Example 4-6 | 4-6-3 | 1-6-2 | 0.20 | 0.20 | 0.2 | 0.2 | 550 |
| Example 4-7 | 4-7-3 | 1-7-2 | 0.20 | 0.21 | 0.2 | 0.3 | 580 |
| Example 4-8 | 4-8-3 | 1-8-2 | 0.21 | 0.20 | 0.2 | 0.2 | 520 |
| Comparative Example 4-1 | C4-1-3 | C1-1-2 | 0.21 | 0.21 | 0.2 | 0.3 | 150 |
| Comparative Example 4-2 | C4-2-3 | C1-2-2 | 0.20 | 0.21 | 0.2 | 0.2 | 140 |
| Comparative Example 4-3 | C4-3-3 | C1-3-2 | 0.20 | 0.20 | 0.2 | 0.2 | 140 |

[Example 5] Container Lid

Example 5-1

A 100-mm-diameter circular piece of multilayer structure was cut out from the multilayer structure (1-1-2) as produced in Example 1-1, and was used as a lid for a container. A flanged container ("Hi-Retoflex" (registered trademark) "HR78-84" (product name) manufactured by Toyo Seikan Co., Ltd.) was prepared for use as a container body. This container has the shape of a 30-mm-high cup whose top surface has a diameter of 78 mm. The top surface of the container is open, and the width of the flange portion formed along the periphery of the top surface is 6.5 mm. The container is made up of a three-layered product having a configuration of "olefin layer/steel layer/olefin layer". Next, the container body was almost completely filled with water, and the lid was heat-sealed to the flange portion, thus obtaining a lidded container (5-1-3). In this heat-sealing of the lid, the lid was set in such a manner that the CPP layer of the lid was in contact with the flange portion. A measurement sample in the shape of a square 4.5 cm on a side was cut out from the lid of the lidded container (5-1-3), and placed on a 10-cm-square aluminum foil (of 30 μm thickness) to cover a 2.0-cm-diameter circular hole made in the foil. The gap between the sample and the aluminum foil was sealed with a two-component curable epoxy adhesive. Using the sample, the oxygen transmission rate and moisture permeability were measured before retorting. The results are shown in Table 6. Another lidded container (5-1-3) was then subjected to retorting (hot water retaining method) under the same conditions as in Example 1-1. Immediately after the hot water treatment, a measurement sample was cut out from the lid, and the oxygen transmission rate and moisture permeability of the sample were measured in the same manner as before the retorting. The T-peel strength was also measured by the method previously described. The results are shown in Table 6. No appearance defect such as delamination was observed.

Examples 5-2 to 5-8 and Comparative Examples 5-1 to 5-3

Lidded containers (5-2-3) to (5-8-3) and (C5-1-3) to (C5-3-3) were produced in the same manner as the lidded container (5-1-3) of Example 5-1, except for using, instead of the multilayer structure (1-1-2), the multilayer structures (1-2-2) to (1-8-2) as produced in Examples 1-2 to 1-8 and the multilayer structures (C1-1-2) to (C1-3-2) as produced in Comparative Examples 1-1 to 1-3. For the lids of the lidded containers obtained, the various properties were measured in the same manner as in Example 5-1. The results are shown in Table 6. The lidded containers (5-2-3) to (5-8-3) showed no appearance defect such as delamination. The lidded containers (C5-1-3) to (C5-3-3) showed delamination.

TABLE 6

| | Lidded container No. | Multilayer structure No. | Oxygen transmission rate | | Moisture permeability | | Peel strength |
| --- | --- | --- | --- | --- | --- | --- | --- |
| | | | Before retorting (mL/(m² · day · atm)) | After retorting | Before retorting (g/(m² · day)) | After retorting | After retorting (g/15 mm) |
| Example 5-1 | 5-1-3 | 1-1-2 | 0.20 | 0.21 | 0.2 | 0.2 | 540 |
| Example 5-2 | 5-2-3 | 1-2-2 | 0.22 | 0.23 | 0.2 | 0.2 | 500 |
| Example 5-3 | 5-3-3 | 1-3-2 | 0.21 | 0.20 | 0.2 | 0.2 | 560 |
| Example 5-4 | 5-4-3 | 1-4-2 | 0.21 | 0.21 | 0.2 | 0.2 | 570 |
| Example 5-5 | 5-5-3 | 1-5-2 | 0.19 | 0.20 | 0.2 | 0.2 | 530 |
| Example 5-6 | 5-6-3 | 1-6-2 | 0.20 | 0.20 | 0.2 | 0.2 | 540 |
| Example 5-7 | 5-7-3 | 1-7-2 | 0.20 | 0.21 | 0.2 | 0.2 | 570 |
| Example 5-8 | 5-8-3 | 1-8-2 | 0.21 | 0.20 | 0.2 | 0.2 | 510 |
| Comparative Example 5-1 | C5-1-3 | C1-1-2 | 0.21 | 0.21 | 0.2 | 0.2 | 140 |

TABLE 6-continued

|  | Lidded container No. | Multilayer structure No. | Oxygen transmission rate | | Moisture permeability | | Peel strength |
|---|---|---|---|---|---|---|---|
|  |  |  | Before retorting (mL/($m^2$ · day · atm)) | After retorting | Before retorting (g/($m^2$ · day)) | After retorting | After retorting (g/15 mm) |
| Comparative Example 5-2 | C5-2-3 | C1-2-2 | 0.20 | 0.21 | 0.2 | 0.2 | 130 |
| Comparative Example 5-3 | C5-3-3 | O1-3-2 | 0.20 | 0.20 | 0.2 | 0.2 | 130 |

[Example 6] in-Mold Labeled Container

Example 6-1

A two-component adhesive was applied to two CPP 100s using a bar coater so that the dry thickness would be 3 μm, and the adhesive was dried. The two-component adhesive used was a two-component reactive polyurethane adhesive composed of "A-525S" of "TAKELAC" (registered trademark) manufactured by Mitsui Chemicals, Inc. and "A-50" of "TAKENATE" (registered trademark) manufactured by Mitsui Chemicals, Inc. Next, the two CPPs and the multilayer structure (1-1-1) of Example 1-1 were laminated together, and the resulting laminate was allowed to stand at 40° C. for 5 days for aging. In this way, a multilayer label (6-1-2) having a configuration of "CPP layer/adhesive layer/base (X-1)/layer (Y-1)/layer (Z-1-1)/adhesive layer/CPP layer" was obtained. The oxygen transmission rate and moisture permeability of the multilayer label (6-1-2) obtained were measured by the methods previously described. The results are shown in Table 7.

The multilayer label (6-1-2) was cut to conform to the inner wall surface of a female mold member of a container-forming mold, and attached to the inner wall surface of the female mold member. A male mold member was then pressed into the female mold member. Next, molten polypropylene ("EA7A" of "NOVATEC" (registered trademark) manufactured by Japan Polypropylene Corporation) was injected into the cavity between the male mold member and female mold member at 220° C. Injection molding was carried out in this way to form the intended in-mold labeled container (6-1-3). The container body had a thickness of 700 μm and a surface area of 83 $cm^2$. The entire exterior of the container was covered with the multilayer label (6-1-2); namely, the multilayer label (6-1-2) overlapped the seam so that the exterior of the container was free of any area that was not covered by the multilayer label (6-1-2). The multilayer label showed no delamination, and the in-mold labeled container (6-1-3) had good appearance.

Examples 6-2 to 6-8 and Comparative Examples 6-1 to 6-3

Multilayer labels (6-2-2) to (6-8-2) and (C6-1-2) to (C6-3-2) were produced in the same manner as the multilayer label (6-1-2) of Example 6-1, except for using, instead of the multilayer structure (1-1-1), the multilayer structures (1-2-1) to (1-8-1) and (C1-1-1) to (C1-3-1) as produced in Examples 1-2 to 1-8 and Comparative Examples 1-1 to 1-3. Next, in-mold labeled containers (6-2-3) to (6-8-3) and (C6-1-3) to (C6-3-3) were produced in the same manner as the in-mold labeled container (6-1-3) of Example 6-1, except for using the multilayer labels (6-2-2) to (6-8-2) and (C6-1-2) to (C6-3-2) instead of the multilayer label (6-1-2) of Example 6-1. For the multilayer labels obtained, the various properties were measured in the same manner as in Example 6-1. The results are shown in Table 7. The in-mold labeled containers (6-2-3) to (6-8-3) had good appearance. By contrast, the in-mold labeled containers (C6-1-3) to (C6-3-3) were observed to suffer from delamination.

TABLE 7

| | Multilayer label No. | Multilayer structure No. | Oxygen transmission rate (mL/($m^2$ · day · atm)) | Moisture permeability (g/($m^2$ · day)) |
|---|---|---|---|---|
| Example 6-1 | 6-1-2 | 1-1-1 | 0.21 | 0.2 |
| Example 6-2 | 6-2-2 | 1-2-1 | 0.21 | 0.2 |
| Example 6-3 | 6-3-2 | 1-3-1 | 0.20 | 0.2 |
| Example 6-4 | 6-4-2 | 1-4-1 | 0.21 | 0.2 |
| Example 6-5 | 6-5-2 | 1-5-1 | 0.19 | 0.2 |
| Example 6-6 | 6-6-2 | 1-6-1 | 0.20 | 0.2 |
| Example 6-7 | 6-7-2 | 1-7-1 | 0.20 | 0.2 |
| Example 6-8 | 6-8-2 | 1-8-1 | 0.19 | 0.2 |
| Comparative Example 6-1 | C6-1-2 | C1-1-1 | 0.17 | 0.2 |
| Comparative Example 6-2 | C6-2-2 | C1-2-1 | 0.20 | 0.2 |
| Comparative Example 6-3 | C6-3-2 | C1-3-1 | 0.20 | 0.2 |

[Example 7] Extrusion Coating Lamination

Example 7-1

An adhesive layer was formed on the layer (Z-1-1) of the multilayer structure (1-1-1) of Example 1-1, and a polyethylene resin (having a density of 0.917 g/$cm^3$ and a melt flow rate of 8 g/10 min) was then applied on the adhesive layer by extrusion coating lamination at 295° C. in such a manner that the applied resin had a thickness of 20 μm. In this way, a laminate (7-1-2) having a configuration of "base (X-1)/layer (Y-1-1)/layer (Z-1-1)/adhesive layer/polyethylene" was obtained.

The adhesive layer was formed by applying a two-component adhesive using a bar coater so that the dry thickness would be 0.3 μm, and then by drying the adhesive. This two-component adhesive used was a two-component reactive polyurethane adhesive composed of "A-3210" of "TAKELAC" (registered trademark) manufactured by Mitsui Chemicals, Inc. and "A-3070" of "TAKENATE" (registered trademark) manufactured by Mitsui Chemicals, Inc. The oxygen transmission rate and moisture permeability of the laminate (7-1-2) were measured by the methods previously described. The results are shown in Table 8. The laminate (7-1-2) showed no appearance defect such as delamination when wound into a roll.

Examples 7-2 to 7-8 and Comparative Examples 7-1 to 7-3

Laminates (7-2-2) to (7-8-2) and (C7-1-2) to (C7-3-2) were produced in the same manner as the laminate (7-1-2) of Example 7-1, except for using the multilayer structures (1-2-1) to (1-8-1) and (C1-1-1) to (C1-3-1) of Examples 1-2 to 1-8 and Comparative Examples 1-1 to 1-3 instead of the multilayer structure (1-1-1). For the laminates obtained, the various properties were measured in the same manner as in Example 7-1. The results are shown in Table 8. The laminates (7-2-2) to (7-8-2) showed no appearance defect such as delamination when wound into rolls. The laminates (C7-1-2) to (C7-3-2) were observed to suffer from partial delamination when wound into rolls.

TABLE 8

| | Laminate No. | Multilayer structure No. | Oxygen transmission rate (mL/(m$^2$ · day · atm)) | Moisture permeability (g/(m$^2$ · day)) |
|---|---|---|---|---|
| Example 7-1 | 7-1-2 | 1-1-1 | 0.20 | 0.2 |
| Example 7-2 | 7-2-2 | 1-2-1 | 0.21 | 0.3 |
| Example 7-3 | 7-3-2 | 1-3-1 | 0.21 | 0.2 |
| Example 7-4 | 7-4-2 | 1-4-1 | 0.20 | 0.2 |
| Example 7-5 | 7-5-2 | 1-5-1 | 0.20 | 0.2 |
| Example 7-6 | 7-6-2 | 1-6-1 | 0.21 | 0.2 |
| Example 7-7 | 7-7-2 | 1-7-1 | 0.18 | 0.2 |
| Example 7-8 | 7-8-2 | 1-8-1 | 0.20 | 0.2 |
| Comparative Example 7-1 | C7-1-2 | C1-1-1 | 0.20 | 0.2 |
| Comparative Example 7-2 | C7-2-2 | C1-2-1 | 0.19 | 0.2 |
| Comparative Example 7-3 | C7-3-2 | C1-3-1 | 0.22 | 0.2 |

[Example 8] Influence of Contained Material

Example 8-1

A flat pouch (3-1-3) as produced in Example 3-1 was filled with 500 mL of a 1.5% aqueous ethanol solution, and subjected to retorting using a retorting apparatus (Flavor Ace RCS-60, manufactured by HISAKA WORKS, LTD.) in hot water at 120° C. and 0.15 MPaG for 30 minutes. A measurement sample was cut out from the flat pouch subjected to retorting, and the oxygen transmission rate of the sample was measured. The oxygen transmission rate of the sample was 0.2 mL/(m$^2$·day·atm).

Examples 8-2 to 8-9

Flat pouches (3-1-3) were subjected to retorting in the same manner as in Example 8-1, except for using other materials instead of the 1.5% aqueous ethanol solution and filling each flat pouch (3-1-3) with 500 mL of one of the other materials. A measurement sample was cut out from each flat pouch subjected to retorting, and the oxygen transmission rate of the sample was measured. The other materials used were a 1.0% aqueous ethanol solution (Example 8-2), vinegar (Example 8-3), an aqueous citric acid solution with a pH of 2 (Example 8-4), an edible oil (Example 8-5), ketchup (Example 8-6), soy sauce (Example 8-7), and a ginger paste (Example 8-8). In any case, the oxygen transmission rate of the sample subjected to retorting was 0.2 mL/(m$^2$·day·atm). In addition, a lidded container (5-1-3) as produced in Example 5-1 was almost completely filled with mikan in syrup and was subjected to retorting in the same manner as in Example 8-1 (Example 8-9). A measurement sample was cut out from the lid of the lidded container subjected to retorting, and the oxygen transmission rate of the sample was measured. The oxygen transmission rate was 0.2 mL/(m$^2$·day·atm).

As clearly demonstrated by Examples 8-1 to 8-9, the packaging materials of the present invention exhibited good barrier performance even after undergoing retorting with various food products contained therein.

[Example 9] Vacuum Insulator

Example 9-1

The two-component reactive polyurethane adhesive as used in Example 6-1 was applied onto a CPP 60 so that the dry thickness would be 3 μm, and the adhesive was dried to form an adhesive layer on the CPP 60. This CPP was bonded to the PET layer of the multilayer structure (1-1-2) as produced in Example 1-1 to obtain a layered product (9-1-1). The above two-component reactive polyurethane adhesive was then applied onto a separately-prepared ONY so that the dry thickness would be 3 μm, and the adhesive was dried to form an adhesive layer on the ONY. This ONY and the layered product (9-1-1) were bonded together to obtain a multilayer structure (9-1-2) having a configuration of "CPP/adhesive layer/multilayer structure (1-1-2)/adhesive layer/ONY layer".

The multilayer structure (9-1-2) was cut to give two laminates having a size of 70 cm×30 cm. The two laminates were stacked together in such a manner that the CPP layers would form inner surfaces of a bag to be produced, and the stack was heat-sealed at its three sides with a seal width of 10 mm. A three-side-seal bag was thus produced. Next, a heat-insulating core material was put into the three-side-seal bag through its opening, and the three-side-seal bag was hermetically closed using a vacuum packaging machine so that the internal pressure was 10 Pa at 20° C. In this way, a vacuum insulator (9-1-3) was obtained. The heat-insulating core material used was a fine silica powder. The vacuum insulator (9-1-3) was left at 40° C. and 15% RH for 360 days, after which the internal pressure of the vacuum insulator was measured using a Pirani gauge. The measured pressure was 37.0 Pa.

The vacuum insulator (9-1-3) was subjected to a durability test (damp heat test) in which it was stored at atmospheric pressure, 85° C., and 85% RH for 1,000 hours using a thermo-hygrostat. Measurement samples were cut out from the vacuum insulator before and after the damp heat test, and the oxygen transmission rate and moisture permeability were measured for the samples. The T-peel strength of the sample subjected to the damp heat test was also measured by the method previously described. The results are shown in Table 9. No appearance defect such as delamination was observed.

Examples 9-2 to 9-8 and Comparative Examples 9-1 to 9-3

Multilayer structures (9-2-2) to (9-8-2) and (C9-1-2) to (C9-3-2) were obtained in the same manner as in Example 9-1, except for using the multilayer structures (1-2-2) to (1-8-2) and (C1-1-2) to (C1-3-2) of Examples 1-2 to 1-8 and Comparative Examples 1-1 to 1-3 instead of the multilayer structure (1-1-2). Vacuum insulators (9-2-3) to (9-8-3) and (C9-1-3) to (C9-3-3) were produced in the same manner as the vacuum insulator (9-1-3) of Example 9-1, except for using the multilayer structures (9-2-2) to (9-8-2) and (C9-1-2) to (C9-3-2) instead of the multilayer structure (9-1-2). For the vacuum insulators obtained, the various properties were measured in the same manner as in Example 9-1. The results are shown in Table 9. The vacuum insulators (9-2-3) to (9-8-3) showed no appearance defect such as delamination. The vacuum insulators (C9-1-3) to (C9-3-3) showed delamination.

Example 9-9

An adhesive layer was formed on the layer (Z-1-1) of the multilayer structure (1-1-1) as obtained in Example 1-1, and another multilayer structure (1-1-1) was then laminated onto the adhesive layer in such a manner that the base (X-1) was in contact with the adhesive layer. A layered product (9-9-1) was thus obtained. Next, an adhesive layer was formed on the layer (Z-1-1) of the layered product (9-9-1), and a VM-EVOH was then laminated onto the adhesive layer in such a manner that the deposited layer of aluminum was in contact with the adhesive layer. On the VM-EVOH layer of the resulting layered product was formed an adhesive layer, and then a CPP 60 was laminated to the adhesive layer.

The resulting layered product was allowed to stand at 40° C. for 5 days for aging. In this way, a multilayer structure (9-9-2) having a configuration of "base (X-1)/layer (Y-1-1)/layer (Z-1-1)/adhesive layer/base (X-1)/layer (Y-1-1)/layer (Z-1-1)/adhesive layer/inorganic deposited layer/oriented EVOH layer/adhesive layer/CPP layer" was obtained. A vacuum insulator (9-9-3) was produced in the same manner as the vacuum insulator (9-1-3) of Example 9-1, except for using the multilayer structure (9-9-2) instead of the multilayer structure (9-1-2). For the vacuum insulator obtained, the various properties were measured in the same manner as in Example 9-1. The results are shown in Table 9. The vacuum insulator (9-9-3) showed no appearance defect such as delamination.

Subsequently, an adhesive layer was formed on the base (x-1) of the multilayer structure (1-1-1) of the layered product, and the layered product and a PET 50 were then laminated together. In this way, a protective sheet (10-1-2) having a configuration of "PET layer/adhesive layer/base (X-1)/layer (Y-1-1)/layer (Z-1-1)/adhesive layer/acrylic resin layer" was obtained. The two adhesive layers were each formed by applying a two-component adhesive so that the dry thickness would be 3 μm and then by drying the adhesive. The two-component adhesive used was a two-component reactive polyurethane adhesive composed of "A-1102" of "TAKELAC" (registered trademark) manufactured by Mitsui Chemicals, Inc. and "A-3070" of "TAKENATE" (registered trademark) manufactured by Mitsui Chemicals, Inc. The oxygen transmission rate and moisture permeability of the protective sheet (10-1-2) obtained were measured. The results are shown in Table 10.

Subsequently, the protective sheet (10-1-2) obtained was examined for durability by performing a test (damp heat test) in which the protective sheet was stored at atmospheric pressure, 85° C., and 85% RH for 1,000 hours using a thermo-hygrostat. The results of measurement of the oxygen transmission rate and moisture permeability of the protective sheet subjected to the test are shown in Table 10. The result of adhesion evaluation conducted on the protective sheet is also shown in Table 10. No appearance defect such as delamination was observed.

Examples 10-2 to 10-8 and Comparative Examples 10-1 to 10-3

Protective sheets (10-2-2) to (10-8-2) and (C10-1-2) to (C10-3-2) were produced in the same manner as the protective sheet (10-1-2) of Example 10-1, except for using the multilayer structures (1-2-1) to (1-8-1) and (C1-1-1) to (C1-3-1) of Examples 1-2 to 1-8 and Comparative Examples 1-1 to 1-3 instead of the multilayer structure (1-1-1). The

TABLE 9

|  | Vacuum insulator No. | Multilayer structure No. | Oxygen transmission rate | | Moisture permeability | | Peel strength |
|---|---|---|---|---|---|---|---|
|  |  |  | Before damp heat test (mL/(m² · day · atm)) | After damp heat test | Before damp heat test (g/(m² · day)) | After damp heat test | After damp heat test (g/15 mm) |
| Example 9-1 | 9-1-3 | 9-1-2 | 0.20 | 0.20 | 0.2 | 0.2 | 550 |
| Example 9-2 | 9-2-3 | 9-2-2 | 0.20 | 0.23 | 0.2 | 0.2 | 520 |
| Example 9-3 | 9-3-3 | 9-3-2 | 0.22 | 0.21 | 0.2 | 0.2 | 550 |
| Example 9-4 | 9-4-3 | 9-4-2 | 0.21 | 0.22 | 0.2 | 0.2 | 560 |
| Example 9-5 | 9-5-3 | 9-5-2 | 0.19 | 0.22 | 0.2 | 0.2 | 540 |
| Example 9-6 | 9-6-3 | 9-6-2 | 0.20 | 0.20 | 0.2 | 0.2 | 550 |
| Example 9-7 | 9-7-3 | 9-7-2 | 0.20 | 0.19 | 0.2 | 0.2 | 560 |
| Example 9-8 | 9-8-3 | 9-8-2 | 0.21 | 0.21 | 0.2 | 0.2 | 510 |
| Example 9-9 | 9-9-3 | 9-9-2 | <0.10 | <0.10 | <0.1 | <0.1 | 540 |
| Comparative Example 9-1 | C9-1-3 | C9-1-2 | 0.21 | 0.21 | 0.2 | 0.2 | 160 |
| Comparative Example 9-2 | C9-2-3 | C9-2-2 | 0.20 | 0.24 | 0.2 | 0.2 | 150 |
| Comparative Example 9-3 | C9-3-3 | C9-3-2 | 0.20 | 0.20 | 0.2 | 0.2 | 150 |

[Example 10] Protective Sheet

Example 10-1

An adhesive layer was formed on the layer (Z-1-1) of the multilayer structure (1-1-1) as produced in Example 1-1, and an acrylic resin film (thickness: 50 μm) was laminated onto the adhesive layer to obtain a layered product.

protective sheets obtained were evaluated. The results are shown in Table 10. As in Example 10-1, the protective sheets (10-2-2) to (10-8-2) showed no appearance defect such as delamination after the damp heat test. By contrast, the protective sheets (C10-1-2) to (C10-3-2) suffered from partial delamination and showed an appearance defect as a result of the damp heat test.

TABLE 10

| | Protective sheet No. | Multilayer structure No. | Oxygen transmission rate | | Moisture permeability | | Peel strength | |
| | | | Before damp heat test | After damp heat test | Before damp heat test | After damp heat test | After damp heat test | Appearance after damp heat test |
| | | | (mL/(m²·day·atm)) | | ((g/(m²·day)) | | (g/15 mm) | |
|---|---|---|---|---|---|---|---|---|
| Example 10-1 | 10-1-2 | 1-1-1 | 0.21 | 0.20 | 0.2 | 0.2 | 450 | A |
| Example 10-2 | 10-2-2 | 1-2-1 | 0.22 | 0.24 | 0.2 | 0.3 | 430 | A |
| Example 10-3 | 10-3-2 | 1-3-1 | 0.22 | 0.21 | 0.2 | 0.2 | 440 | A |
| Example 10-4 | 10-4-2 | 1-4-1 | 0.19 | 0.21 | 0.2 | 0.2 | 450 | A |
| Example 10-5 | 10-5-2 | 1-5-1 | 0.20 | 0.21 | 0.2 | 0.2 | 450 | A |
| Example 10-6 | 10-6-2 | 1-6-1 | 0.21 | 0.22 | 0.2 | 0.2 | 450 | A |
| Example 10-7 | 10-7-2 | 1-7-1 | 0.20 | 0.23 | 0.2 | 0.2 | 420 | A |
| Example 10-8 | 10-8-2 | 1-8-1 | 0.19 | 0.23 | 0.2 | 0.2 | 400 | A |
| Comparative Example 10-1 | C10-1-2 | C1-1-1 | 0.19 | 0.24 | 0.2 | 0.2 | 120 | B |
| Comparative Example 10-2 | C10-2-2 | C1-2-1 | 0.21 | 0.22 | 0.2 | 0.2 | 110 | B |
| Comparative Example 10-3 | C10-3-2 | C1-3-1 | 0.20 | 0.21 | 0.2 | 0.2 | 120 | B |

Example 10-9

A solar cell module was produced using the protective sheet (10-1-2) as obtained in Example 10-1. Specifically, first, an amorphous silicon solar cell placed on a 10-cm-square tempered glass plate was sandwiched between ethylene-vinyl acetate copolymer films with a thickness of 450 μm. The protective sheet (10-1-2) was then bonded onto one of the films in such a manner that the polyethylene terephthalate layer of the protective sheet (10-1-2) faced outwardly. In this way, a solar cell module was produced. The bonding was accomplished by vacuum drawing at 150° C. for 3 minutes, followed by compression bonding for 9 minutes. The solar cell module thus produced operated well and continued to exhibit good electrical output characteristics over a long period of time.

INDUSTRIAL APPLICABILITY

The present invention is applicable to a multilayer structure, a packaging material including the multilayer structure, and a method for producing a multilayer structure. According to the present invention, it is possible to obtain a multilayer structure having good gas barrier properties and good water vapor barrier properties and having high retort resistance and high stretching resistance. The use of the multilayer structure of the present invention makes it possible to obtain a good packaging material. The present invention is also applicable to a protective sheet including a multilayer structure and an electronic device including the protective sheet. According to the present invention, it is possible to obtain an electronic device including a protective sheet including a multilayer structure that has good gas barrier properties and good water vapor barrier properties and that retains good interlayer adhesion even at high temperature and high humidity. According to the present invention, therefore, it is possible to obtain an electronic device capable of maintaining good properties not only during production and distribution but also during actual use which often lasts for a long period of time.

The invention claimed is:
1. A multilayer structure, comprising a base (X), a layer (Y), and a layer (Z), wherein:
the layer (Y) comprises an aluminum-containing compound (A); and
the layer (Z) comprises an organic phosphorus compound (BO) and a polymer (F) having an ether bond and having no glycosidic bond,
wherein the aluminum-containing compound (A) is a compound (Ab) comprising a reaction product (D) formed by a reaction between an aluminum-containing metal oxide (Aa) and an inorganic phosphorus compound (BI).
2. The multilayer structure according to claim 1, comprising at least one pair of the layer (Z) and the layer (Y) that are disposed contiguous to each other.
3. The multilayer structure according to claim 1, wherein the ratio $W_{BO}/W_{BI}$ between the mass $W_{BI}$ of the inorganic phosphorus compound (BI) and the mass $W_{BO}$ of the organic phosphorus compound (BO) is 0.06 or more.
4. The multilayer structure according to claim 1, wherein the mass ratio between the organic phosphorus compound (BO) and the polymer (F) is 30:70 to 99:1.
5. The multilayer structure according to claim 1, wherein the organic phosphorus compound (BO) is a polymer having at least one functional group selected from the group consisting of a phosphoric acid group, a phosphorous acid group, a phosphonic acid group, a phosphonous acid group, a phosphinic acid group, and a phosphinous acid group.
6. The multilayer structure according to claim 1, wherein the polymer (F) is polyethylene glycol or polyethylene oxide.
7. The multilayer structure according to claim 1, wherein the base (X) comprises at least one layer selected from the group consisting of a thermoplastic resin film layer and a paper layer.
8. The multilayer structure according to claim 1, wherein the polymer (F) is a polyoxyalkylene polymer.
9. The multilayer structure according to claim 1, wherein the polymer (F) is a polyoxyalkylene polymer (Fa) having a repeating unit represented by the following formula (III)

$$—R^5—O— \quad (III)$$

wherein $R^5$ is an optionally substituted, linear or branched alkylene group having 1 to 14 carbon atoms.
10. The multilayer structure according to claim 1, wherein the polymer (F) is a polyalkylene glycol polymer (Fb) having a repeating unit represented by the following formula (III)

$$—R^5—O— \quad (III)$$

wherein R⁵ is an optionally substituted, linear or branched alkylene group having 1 to 14 carbon atoms.

11. The multilayer structure according to claim 1, wherein the polymer (F) is a polyoxymethylene, a polyethylene glycol, a polyethylene oxide, a polypropylene glycol, a polypropylene oxide, a polyoxyethylene polyoxypropylene glycol, or a polytetramethylene ether glycol.

12. The multilayer structure according to claim 1, wherein the polymer (F) is a polyalkylene glycol polymer comprising an alkylene group comprising 2 to 4 carbon atoms.

13. A packaging material, comprising the multilayer structure according to claim 1.

14. The packaging material according to claim 13, further comprising a layer formed by extrusion coating lamination.

15. The packaging material according to claim 13, being a vertical form-fill-seal bag, a vacuum packaging bag, a pouch, a laminated tube container, an infusion bag, a paper container, a strip tape, a container lid, or an in-mold labeled container.

16. A product, comprising the packaging material according to claim 13 at least a part of the product.

17. A vacuum insulator, comprising the product according to claim 16, wherein:
the product contains a substance in an interior thereof;
the substance is a core material; and
the interior of the product has a reduced pressure.

18. A protective sheet for electronic devices, the protective sheet comprising the multilayer structure according to claim 1.

19. A method for protecting a surface of a photoelectric conversion device, information display device, or lighting device, the method comprising contacting the surface with the protective sheet according to claim 18.

20. An electronic device, comprising the protective sheet according to claim 18.

* * * * *

UNITED STATES PATENT AND TRADEMARK OFFICE
CERTIFICATE OF CORRECTION

PATENT NO. : 10,647,487 B2
APPLICATION NO. : 15/760712
DATED : May 12, 2020
INVENTOR(S) : Ryoichi Sasaki et al.

Page 1 of 1

It is certified that error appears in the above-identified patent and that said Letters Patent is hereby corrected as shown below:

On the Title Page

Item (73), the Assignee's name is incorrect. Item (73) should read:
-- (73) Assignee: KURARAY CO., LTD., Kurashiki-shi (JP) --

Signed and Sealed this
Fourteenth Day of July, 2020

Andrei Iancu
*Director of the United States Patent and Trademark Office*